United States Patent
Kubo

(10) Patent No.: US 12,356,789 B2
(45) Date of Patent: Jul. 8, 2025

(54) LIGHT-EMITTING DEVICE, AND METHOD FOR MANUFACTURING LIGHT-EMITTING DEVICE

(71) Applicant: SHARP KABUSHIKI KAISHA, Sakai (JP)

(72) Inventor: Masumi Kubo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 604 days.

(21) Appl. No.: 17/793,642

(22) PCT Filed: Feb. 6, 2020

(86) PCT No.: PCT/JP2020/004598
§ 371 (c)(1),
(2) Date: Jul. 18, 2022

(87) PCT Pub. No.: WO2021/157019
PCT Pub. Date: Aug. 12, 2021

(65) Prior Publication Data
US 2023/0053170 A1    Feb. 16, 2023

(51) Int. Cl.
H01L 51/50       (2006.01)
H10K 50/115   (2023.01)
H10K 71/00     (2023.01)

(52) U.S. Cl.
CPC ........... *H10K 50/115* (2023.02); *H10K 71/00* (2023.02)

(58) Field of Classification Search
CPC ............................. H10K 50/115; H10K 71/00
See application file for complete search history.

(56) References Cited

U.S. PATENT DOCUMENTS

| 7,880,377 B2* | 2/2011 | Orita | H10H 20/812 |
| | | | 313/503 |
| 2014/0349430 A1* | 11/2014 | Kim | H10H 20/812 |
| | | | 438/758 |

FOREIGN PATENT DOCUMENTS

JP    2017-025220 A    2/2017

OTHER PUBLICATIONS

Masami Tanemura, "Random Packing (Physics on Form, Workshop Report)", Bussei Kenkyu (1984), 42 (1): 76-77, Apr. 20, 1984.

* cited by examiner

*Primary Examiner* — Nathan T Leong
(74) *Attorney, Agent, or Firm* — ScienBiziP, P.C.

(57) ABSTRACT

A method for manufacturing a light-emitting device a first solution including a first solvent, quantum dots, a ligand, and a first inorganic precursor, the quantum dots each including a core and a first shell performing first heating of raising to a first temperature or higher, the first temperature being a higher temperature of a melting point of the ligand and a boiling point of the first solvent, and performing second heating of raising to a second temperature, the second temperature being higher than the first temperature and being a temperature at which the first inorganic precursor epitaxially grows and a second shell coating the first shell is formed to form a plurality of first quantum dots, and wherein a plurality of second quantum dots each including, in a core, the same material as a material of the second shells are also formed.

26 Claims, 13 Drawing Sheets

LIGHT-EMITTING DEVICE, AND METHOD FOR MANUFACTURING LIGHT-EMITTING DEVICE

TECHNICAL FIELD

The disclosure relates to a light-emitting device, and a method for manufacturing the light-emitting device.

BACKGROUND ART

PTL 1 discloses a semiconductor nanoparticle (quantum dot) having a core/shell structure and a ligand that coordinates with the semiconductor nanoparticle.

CITATION LIST

Patent Literature

PTL 1: JP 2017-025220 A

Non Patent Literature

NPL 1: Tanemura Masami, "Random Packing (Physics on Form, Workshop Report)", Bussei Kenkyu (1984), 42 (1), 76-77

SUMMARY

Technical Problem

An improvement in luminous efficiency is desired in a light-emitting device including a quantum dot layer.

Solution to Problem

In order to solve the problem described above, a method for manufacturing a light-emitting device according to the disclosure is a method for manufacturing a light-emitting device including, on a substrate, a light-emitting element including a first electrode, a second electrode, and a quantum dot layer between the first electrode and the second electrode, and the method includes forming the quantum dot layer, wherein the forming the quantum dot layer includes performing first application of applying, on a position overlapping with the substrate, a first solution including a first solvent, a plurality of quantum dots, a ligand, and a first inorganic precursor, the plurality of quantum dots each including a core and a first shell coating the core, the ligand coordinating with each of the plurality of quantum dots, performing first heating of raising an atmospheric temperature around the substrate to a first temperature or higher after the performing first application, the first temperature being a higher temperature of a melting point of the ligand and a boiling point of the first solvent, and performing second heating of raising the atmospheric temperature to a second temperature after the performing first heating, the second temperature being higher than the first temperature and being a temperature at which the first inorganic precursor epitaxially grows around the first shell and a second shell coating the first shell is formed to form a plurality of first quantum dots, and in the performing second heating, the plurality of first quantum dots are formed in the quantum dot layer, and a plurality of second quantum dots each including, in a core, the same material as a material of the plurality of second shells are also formed.

Further, in order to solve the problem described above, a light-emitting device according to the disclosure is a light-emitting device including, on a substrate, a light-emitting element including a first electrode, a second electrode, and a quantum dot layer between the first electrode and the second electrode, wherein the quantum dot layer includes a plurality of first quantum dots each including a core, a first shell coating the core, and a second shell coating the first shell, the first shell and the second shell having a crystal structure, and a plurality of second quantum dots each including, in a core, the same material as a material of the second shell.

Advantageous Effects of Disclosure

According to the configurations described above, luminous efficiency may be further improved in a light-emitting device provided with quantum dots.

DESCRIPTION OF EMBODIMENTS

First Embodiment

Figure 1A:
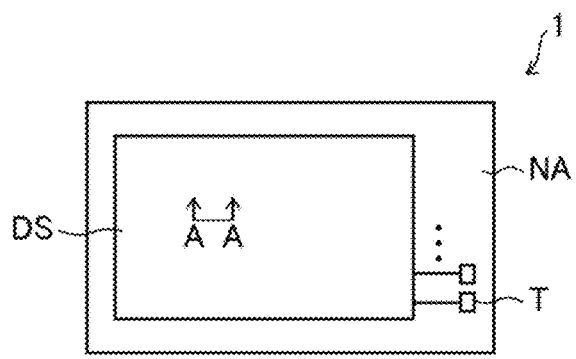
FIG. 1A is a schematic top view of a light-emitting device according to a first embodiment.
Figure 1B:
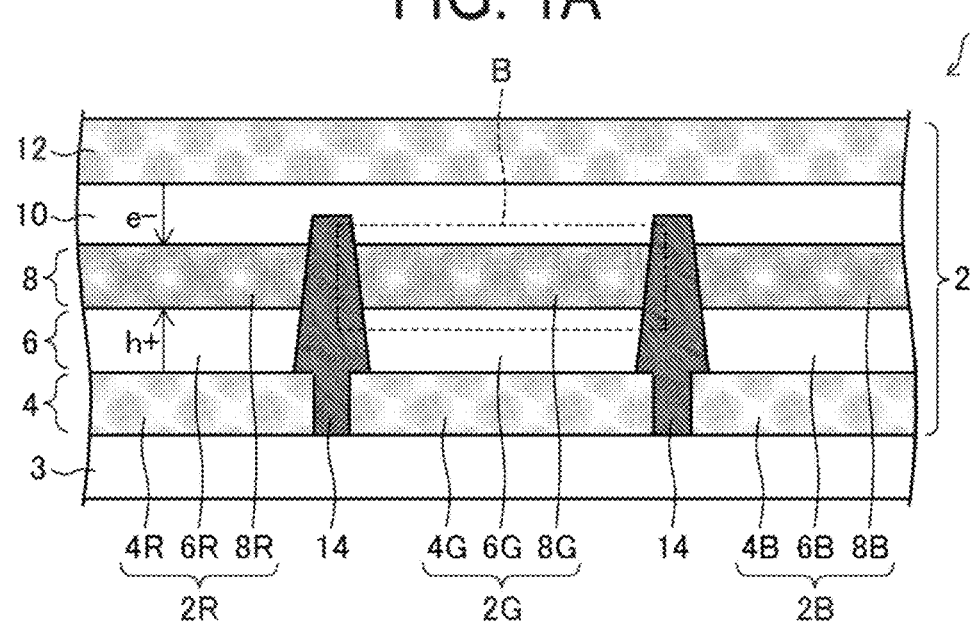
FIG. 1B is a cross-sectional view taken along a line A-A in FIG. 1A.
Figure 1C:
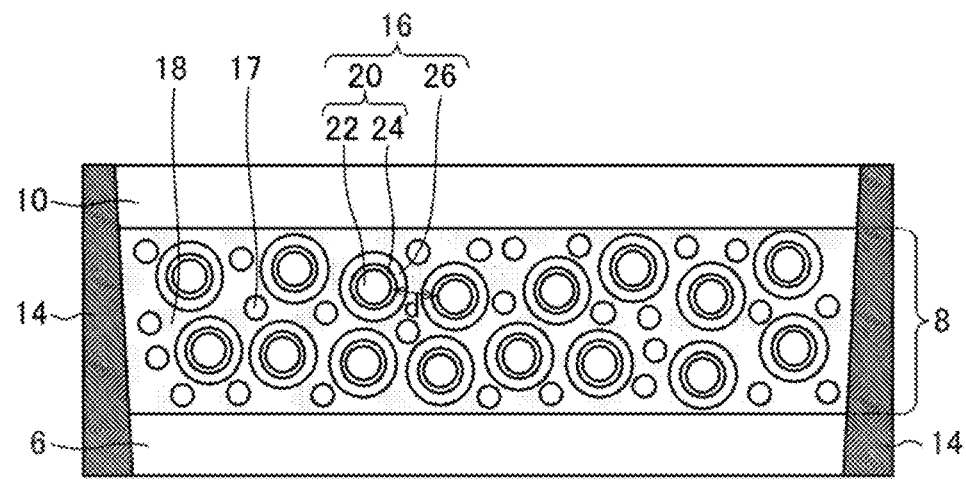
FIG. 1C, is an enlarged cross-sectional view of a region B in FIG. 1B.

FIG. 1A is a schematic top view of a light-emitting device 1 according to the present embodiment. FIG. 1B is a cross-sectional view taken along a line A-A in FIG. 1A. FIG. 1C is an enlarged cross-sectional view of a region B in FIG. 1B, that is, an enlarged cross-sectional view of a perimeter of a second light-emitting layer 8G to be described later.

As illustrated in FIG. 1A, the light-emitting device 1 according to the present embodiment includes a light-emitting face DS from which light emission is extracted and a frame region NA surrounding a periphery of the light-emitting face DS. In the frame region NA, a terminal T may be formed into which a signal for driving a light-emitting element of the light-emitting device 1 described in detail later is input.

At a position overlapping with the light-emitting face DS in plan view, as illustrated in FIG. 1B, the light-emitting device 1 according to the present embodiment includes a light-emitting element layer 2 and an array substrate 3. The light-emitting device 1 has a structure in which respective layers of the light-emitting element layer 2 are layered on the array substrate 3, in which a thin film transistor (TFT; not illustrated) is formed. In the present specification, a direction from the light-emitting element layer 2 to the array substrate 3 of the light-emitting device I is referred to as "downward direction", and a direction from the light-emitting element layer 2 to the light-emitting face DS of the light-emitting device 1 is referred to as "upward direction".

The light-emitting element layer 2 includes, on a first electrode 4, a first charge transport layer 6, a light-emitting layer 8 as a quantum dot layer, a second charge transport layer 10, and a second electrode 12, which are sequentially layered from the lower layer. The first electrode 4 of the light-emitting element layer 2 formed in the upper layer of the array substrate 3 is electrically connected to the TFT of the array substrate 3. In the present embodiment, the first electrode 4 is an anode electrode and the second electrode 12 is a cathode electrode, for example.

In the present embodiment, the light-emitting element layer 2 includes a first light-emitting element 2R, a second light-emitting element 2G, and a third light-emitting element 2B. The first light-emitting element 2R, the second light-emitting element 2G, and the third light-emitting element 2B are quantum-dot light emitting diode (QLED) elements in which the light-emitting layer 8 includes a semiconductor nanoparticle material, that is, a quantum dot material, and the quantum dot material is caused to emit light in the light-emitting layer 8.

Each of the first electrode 4, the first charge transport layer 6, and the light-emitting layer 8 is separated by edge covers 14. In particular, in the present embodiment, the first electrode 4 is, by the edge covers 14, separated into a first electrode 4R for the first light-emitting element 2R, a first electrode 4G for the second light-emitting element 2G, and a first electrode 4B for the third light-emitting element 2B. The first charge transport layer 6 is, by the edge covers 14, separated into a first charge transport layer 6R for the first light-emitting element 2R, a first charge transport layer 6G for the second light-emitting element 2G, and a first charge transport layer 6B for the third light-emitting element 2B. Further, the light-emitting layer 8 is, by the edge covers 14, separated into a first light-emitting layer 8R, the second light-emitting layer 8G, and a third light-emitting layer 8B.

The second charge transport layer 10 and the second electrode 12 are not separated by the edge covers 14, and are each formed in a shared manner. As illustrated in FIG. 1B, the edge covers 14 may be formed at the positions to cover side surfaces of the first electrode 4 and the vicinity of peripheral end portions of an upper face thereof.

In the present embodiment, the first light-emitting element 2R includes the first electrode 4R, the first charge transport layer 6R, the first light-emitting layer 8R, the second charge transport layer 10, and the second electrode 12. The second light-emitting element 2G includes the first electrode 4G, the first charge transport layer 6G, the second light-emitting layer 8G, the second charge transport layer 10, and the second electrode 12. Furthermore, the third light-emitting element 2B includes the first electrode 4B, the first charge transport layer 6B, the third light-emitting layer 8B, the second charge transport layer 10, and the second electrode 12.

In the present embodiment, the first light-emitting layer 8R, the second light-emitting layer 8G, and the third light-emitting layer 8B emit red light that is light of a first color, green light that is light of a second color, and blue light that is light of a third color, respectively. In other words, the first light-emitting element 2R, the second light-emitting element 2G, and the third light-emitting element 2B are light-emitting elements that emit the red light, the green light, and the blue light, respectively, which are different colors from each other.

Here, the blue light refers to, for example, light having a light emission central wavelength in a wavelength band of equal to or greater than 400 nm and equal to or less than 500 nm. The green light refers to, for example, light having a light emission central wavelength in a wavelength band of greater than 500 nm and equal to or less than 600 nm. The red light refers to, for example, light having a light emission central wavelength in a wavelength band of greater than 600 nm and equal to or less than 780 nm.

The first electrode 4 and the second electrode 12 include conductive materials and are electrically connected to the first charge transport layer 6 and the second charge transport layer 10, respectively. Of the first electrode 4 and the second electrode 12, the electrode closer to the light-emitting face DS is a transparent electrode.

In particular, in the present embodiment, the array substrate 3 is a transparent substrate, and the first electrode 4 is a transparent electrode. The second electrode 12 may be a reflective electrode. Therefore, light from the light-emitting layer 8 passes through the first charge transport layer 6, the first electrode 4, and the array substrate 3, and is emitted from the light-emitting face DS to the outside of the light-emitting device 1. Due to this, the light-emitting device 1 is configured as a bottom-emitting type light-emitting device. Since both the light emitted in the upward direction from the light-emitting layer 8 and the light emitted in the downward direction from the light-emitting layer 8 are available as light emission from the light-emitting device 1, the light-emitting device 1 can improve the usage efficiency of the light emitted from the light-emitting layer 8.

Note that the configuration of the first electrode 4 and the second electrode 12 described above is an example, and may be configured with other materials.

The first charge transport layer 6 is a layer that transports charges from the first electrode 4 to the light-emitting layer 8. The first charge transport layer 6 may have a function of inhibiting the transport of charges from the second electrode 12. In the present embodiment, the first charge transport layer 6 may be a hole transport layer that transports positive holes from the first electrode 4, which is an anode electrode, to the light-emitting layer 8.

The second charge transport layer 10 is a layer that transports the charge from the second electrode 12 to the light-emitting layer 8. The second charge transport layer 10 may have a function of inhibiting the transport of the charges from the first electrode 4. In the present embodiment, the second charge transport layer 10 may be an electron transport layer that transports electrons from the second electrode 12, which is a cathode electrode, to the light-emitting layer 8.

Next, the configuration of the light-emitting layer 8 will be described in detail with reference to FIG. 1C. Note that, FIG. 1C is a schematic cross-sectional view of the region B in FIG. 1B, that is, a schematic cross-sectional view of the periphery of the second light-emitting layer 8G of the second light-emitting element 2G. However, in the present embodiment, unless otherwise indicated, members illustrated in FIG. 1C are considered to have configurations common to each of the light-emitting elements. Accordingly, in the present embodiment, unless otherwise indicated, the members illustrated in FIG. 1C may have the same configurations as those in each of the light-emitting elements.

In the present embodiment, the light-emitting layer 8 includes a first quantum dot 16, a second quantum dot 17, and a ligand 18. The first quantum dot 16 include each of a plurality of quantum dots 20. The quantum dot 20 has a core/shell structure including a core 22 and a first shell 24, with which the periphery of the core 22 is coated. The first quantum dot 16 includes a second shell 26. The second shell 26 coats a periphery of the first shell 24 being an outer shell of each of the quantum dots 20.

The quantum dot 20 may have a multi-shell structure in which a plurality of shells are provided around the core 22. In this case, the first shell 24 refers to a shell corresponding to the outermost layer among the plurality of shells.

The ligand 18 may coordinate with the first quantum dot 16 on an outer surface of the second shell 26 to fill a void in the first quantum dot 16. Further, the ligand 18 also coordinates with the second quantum dot 17 on an outer surface of the second quantum dot 17. The ligand 18 may be, for example, trioctylphosphine oxide (TOPO).

As illustrated in FIG. 1C, in the present embodiment, the ligand 18 is interposed between adjacent first quantum dots 16. That is, adjacent first quantum dots 16 are separated from each other. Note that, among the quantum dots 20, at least one set of quantum dots 20 adjacent to each other may be connected to each other via the second shell 26. The first shell 24 and the second shell 26 have a crystal structure, and in particular, in the present embodiment, the second shell 26 has a crystal structure formed by epitaxial growth on the first shell 24. In the present embodiment, all the quantum dots 20 within the same light-emitting element may be connected to each other by the crystal structure of the second shell 26 to form an integral quantum dot structure. The first shell 24 and the second shell 26 may be polycrystalline.

The core 22 and first shell 24 of the quantum dot 20 may include an inorganic material used for the quantum dots of a known core/shell structure. In other words, the first light-emitting layer 8R, the second light-emitting layer 8G, and the third light-emitting layer 8B may include known quantum dot materials used for light-emitting layers of red, green, and blue QLED elements, respectively.

In addition, similar to the first shell 24, the second shell 26 may include an inorganic shell material used for the quantum dots of a known core/shell structure. The first shell 24 and the second shell 26 may be made of the same material. Note that a specific resistance of the second shell 26 is preferably equal to or greater than a specific resistance of the first shell 24. Further, the size of a band gap of the second shell 26 is preferably greater than the size of a band gap of the first shell 24. With this configuration, the efficiency of charge injection from the second shell 26 to the first shell 24 is improved.

Examples of specific materials for the core 22 include group II-VI semiconductors such as CdSe (band gap 1.73 eV), CdTe (band gap 1.44 eV), ZnTe (band gap 2.25 eV), and CdS (band gap 2.42 eV). Examples of other specific materials for the core 22 include group III-V semiconductors such as InP (band gap 1.35 eV) and InGaP (band gap 1.88 eV).

In general, a wavelength of light emitted by the quantum dot is determined by the particle diameter of the core. Therefore, it is preferable to employ a semiconductor material having an appropriate band gap as a material of the core 22 in order to control the light emitted from the core 22 to be any of red, green, and blue colors, by controlling the particle diameter of the core 22.

The band gap of the material of the core 22 included in the first light-emitting layer 8R is preferably equal to or lower than 1.97 eV in order for the first light-emitting layer 8R serving as a red light-emitting layer to emit red light having a wavelength of 630 nm. In order for the second light-emitting layer 8G serving as a green light-emitting layer to emit green light having a wavelength of 532 nm, the band gap of the material of the core 22 included in the second light-emitting layer 8G is preferably equal to or lower than 2.33 eV. Furthermore, in order for the third light-emitting layer 8B serving as a blue light-emitting layer to emit blue light having a wavelength of 630 nm, the band gap of the material of the core 22 included in the third light-emitting layer 8B is preferably equal to or lower than 2.66 eV. The light-emitting device 1 provided with the first light-emitting layer 8R, the second light-emitting layer 8G, and the third light-emitting layer 8B is preferable from the perspective of satisfying the color space criteria in the International Standard BT 2020 of UHDTV.

Examples of specific materials for the first shell 24 and the second shell 26 include group II-VI semiconductors such as ZnSe (band gap 2.7 eV) and ZnS (band gap 3.6 eV). Further, examples of specific materials for the first shell 24 and the second shell 26 include group III-V semiconductors such as GaP (band gap 2.26 eV).

The material of the core 22 preferably has low specific resistance and a small band gap compared to the material of the first shell 24 and the second shell 26. With this configuration, the efficiency of charge injection from the first shell 24 and second shell 26 to the core 22 is improved.

Note that, in the present embodiment, an average film thickness of the first shell 24 from the outer surface of the core 22 is less than a minimum film thickness of the second shell 26. Here, the minimum film thickness of the second shell 26 refers to a film thickness of the second shell 26 between two quantum dots 20 connected to each other via the second shell 26, or the least film thickness of a film thickness from the first shell 24 to the outer surface of the second shell 26.

As illustrated in FIG. 1C, the shortest distance from the core 22 of one first quantum dot 16 to the core 22 of another first quantum dot adjacent thereto is defined as d. For example, when the core 22 is made of InP, and the first shell 24 and second shell 26 are made of ZnS, an average value of the distance d is preferably equal to or greater than 3 nm. For example, when the core 22 is made of CdSe, and the first shell 24 and second shell 26 are made of ZnS, an average value of the distanced is preferably equal to or greater than 1 nm. With this configuration, the electron exudation from the core 22, derived from the electron wave function, may be efficiently reduced by the first shell 24 and the second shell 26.

The second quantum dot 17 is formed of the same material as the second shell 26. A part of the charge injected into the light-emitting layer 8 is injected into the first quantum dot 16 via the second quantum dot 17. Thus, the charge injected into the light-emitting layer 8 is easily injected into the first quantum dot 16. As a result, the luminous efficiency in the light-emitting device 1 can be improved.

The second quantum dot 17 is preferably formed by using a semiconductor material having a band gap of equal to or greater than 3.1 eV. Further, when the second quantum dot 17 is formed by using a semiconductor material having a band gap of less than 3.1 eV, the second quantum dot 17 preferably has a particle diameter having a light emission wavelength of equal to or less than 400 nm. In this way, the second quantum dot 17 emits ultraviolet light having a light emission wavelength of less than 400 nm, and thus a decrease in color purity of the luminescent color of the light-emitting layer 8 due to the luminescent color of the second quantum dot 17 can be suppressed. Examples of the semiconductor material having a band gap of equal to or greater than 3.1 eV include ZnS:Eg=3.6 eV, ZnO:Eg=3.37 eV, CuCl:Eg=3.2 eV, and the like. When the second quantum dot 17 is formed by CdS:Eg=2.4 eV the second quantum dot 17 preferably has a particle diameter (diameter) of equal to or less than 2 nm.

When the second quantum dot 17 emits ultraviolet light, an ultraviolet light cut filter that absorbs a wavelength band of ultraviolet light may be provided above the light-emitting layer 8. In this way, a decrease in color purity of the luminescent color of the light-emitting layer 8 due to the luminescent color of the second quantum dot 17 can be further suppressed.

Figure 2:
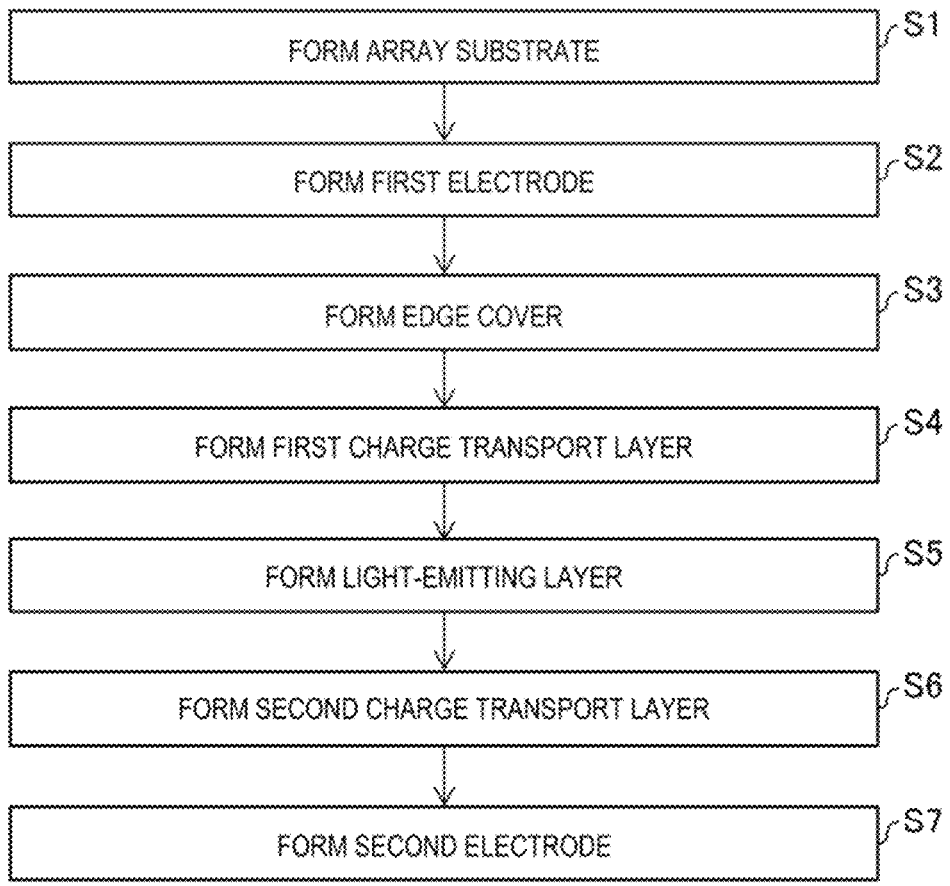
FIG. 2 is a flowchart for describing a method for manufacturing the light-emitting device according to the first embodiment.

Next, a method for manufacturing the light-emitting device 1 according to the present embodiment will be described with reference to FIG. 2. FIG. 2 is a flowchart for describing the method for manufacturing the light-emitting device 1 according to the present embodiment.

First, the array substrate 3 is formed (step S1). Formation of the array substrate 3 may be performed by forming a plurality of TFTs on the substrate to match positions of the subpixels.

Next, the first electrode 4 is formed (step S2). In step S2, for example, after a transparent electrode material having electrical conductivity, such as ITO, is film-formed by sputtering, the first electrode 4 may be formed for each subpixel by patterning while matching a shape of the subpixel. Alternatively, the first electrode 4 may be formed for each subpixel by vapor-depositing a transparent electrode material by using a vapor deposition mask.

Next, the edge covers 14 are formed (step S3). The edge covers 14, after being applied on the array substrate 3 and the first electrode 4, may be obtained by patterning while leaving the positions covering the side surfaces and peripheral end portions of the first electrodes 4 between the adjacent first electrodes 4. The patterning of the edge covers 14 may be performed by photolithography.

Next, the first charge transport layer 6 is formed (step S4). The first charge transport layer 6 may be formed for each subpixel by separately patterning with an ink-jet method, vapor deposition using a mask, or patterning using photolithography.

Next, the light-emitting layer 8 is formed (step S5). The step of forming the light-emitting layer 8 will be described in more detail with reference to FIGS. 3 to 6.

Figure 3:
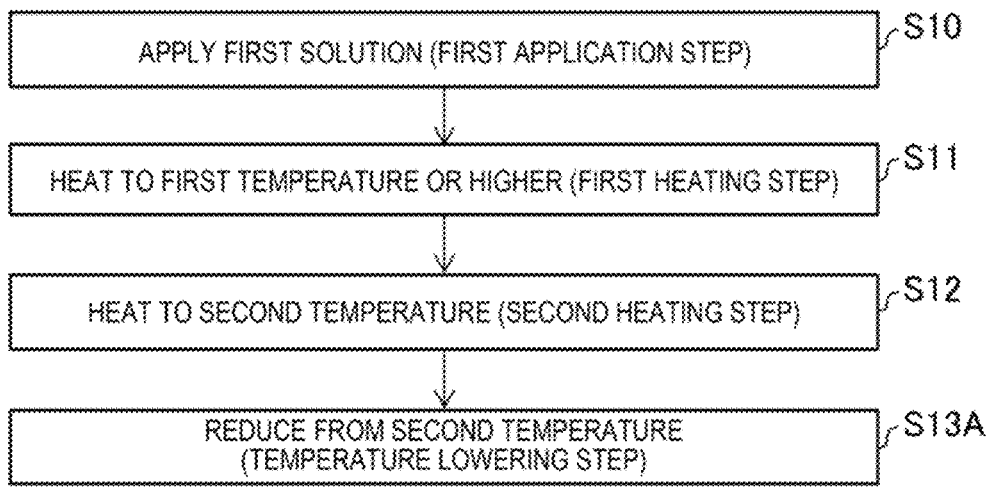
FIG. 3 is a flowchart for describing a step of forming a light-emitting layer according to the first embodiment.

FIG. 3 is a flowchart for describing the step of forming the light-emitting layer corresponding to a step of forming a quantum dot layer in the present embodiment.

Figure 4:
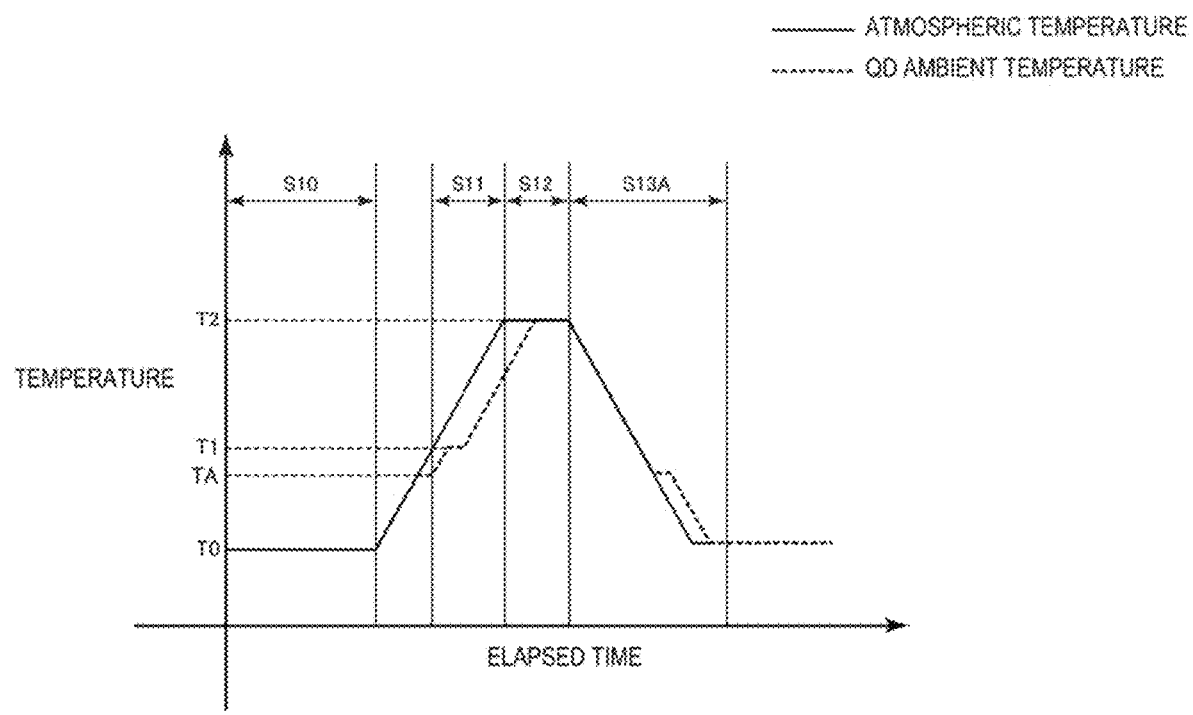
FIG. 4 is a graph for describing a relationship between an elapsed time and a temperature in a step of forming the light-emitting layer according to the first embodiment.

FIG. 4 is a graph for describing a relationship between an elapsed time and a temperature in the step of forming the light-emitting layer. In FIG. 4, the horizontal axis represents the elapsed time of the step of forming the light-emitting layer, and the vertical axis represents the temperature. A solid line in FIG. 4 indicates a temperature of the atmosphere around the array substrate 3, a broken line indicates a temperature around the quantum dots 20 on the array substrate 3, and a dotted line indicates a temperature of the ligand 18 except for the ligand 18 disposed around the quantum dots 20. Hereinafter, the term "atmosphere" simply indicates the atmosphere around the array substrate 3.

FIGS. 5A, 5B, 6A, and 6B are diagrams (forming-step cross-sectional views) for describing the step of forming the light-emitting layer. Hereinafter, each of the forming-step cross-sectional views including FIGS. 5A, 5B, 6A, and 6B of the present specification illustrates the forming-step cross-sectional view of the region B in FIG. 1B, that is, the forming-step cross-sectional view at the position corresponding to the periphery of the second light-emitting layer 8G of the second light-emitting element 2G. However, the techniques described with reference to the forming-step cross-sectional views in the present specification may be applied to the method for forming the light-emitting layer 8 of the other light-emitting elements, unless otherwise specified.

Figure 5A:
FIG. 5A is a cross-sectional view of a substrate before the light-emitting layer according to the first embodiment is formed.

As illustrated in FIG. 5A, the formation up to the first charge transport layer 6 has been performed on the array substrate 3 until the step of forming the light-emitting layer. In the step of forming the light-emitting layer, first, a step of first application is performed in which a first solution 28 illustrated in FIG. 5B is applied on a position overlapping with the array substrate 3 (step S10).

Figure 5B:
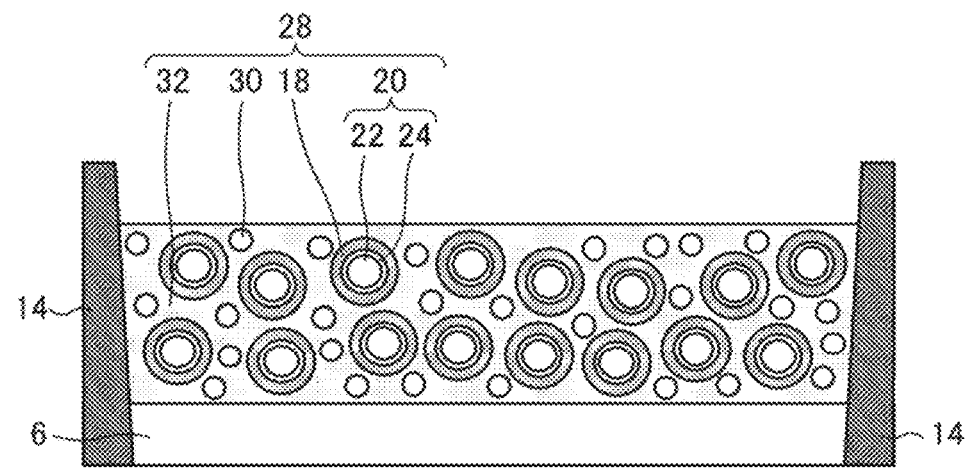
FIG. 5B is a cross-sectional view of the substrate in FIG. 5A after a first solution is applied.

The first solution 28 is a solution in which the plurality of quantum dots 20 with the ligand 18 being coordinated and a first inorganic precursor 30 are dispersed in a first solvent 32, as illustrated in FIG. 5B. The first solvent 32 may be, for example, hexane. The first inorganic precursor 30 contains the same material as the second shell 26 described above. The first inorganic precursor 30 may contain, for example, zinc chloride and 1-Dodecanethiol.

The step of the first application is performed at an atmospheric temperature of a temperature T0, as illustrated in FIG. 4. Since the application of the first solution 28 is performed at the atmospheric temperature of the temperature T0, an ambient temperature of the quantum dots 20 in the first solution 28 to be applied also takes the temperature T0, as illustrated in FIG. 4. The temperature T0 may be, for example, an ordinary temperature.

Next, the array substrate 3, on which the first solution 28 is applied, is set in a furnace or the like, and heating of the atmosphere is started. Here, a step of first heating is performed by heating the atmosphere until the atmospheric temperature becomes equal to or higher than a first temperature T1 indicated in FIG. 4 (step S11). Note that the step of heating the array substrate 3 (such as the step of the first heating) may be performed by irradiating the array substrate 3 with light such as ultraviolet light.

The first temperature T1 is the higher temperature of the melting point of the ligand 18 and the boiling point of the first solvent 32. A temperature TA indicated in FIG. 4 is the lower temperature of the melting point of the ligand 18 and the boiling point of the first solvent 32. The first temperature T1 and the temperature TA are higher than the temperature T0. Note that the temperature TA may be the boiling point of the first solvent 32, and the first temperature T1 may be the melting point of the ligand 18.

The melting point of TOPO is in a range from 50 degrees Celsius to 54 degrees Celsius, and the boiling point of hexane is in a range from 68.5 degrees Celsius to 69.1 degrees Celsius. Accordingly, in a case where the ligand 18 is TOPO and the first solvent 32 is hexane, the temperature TA is the melting point of the TOPO, and the first temperature T1 is the boiling point of the hexane.

The ambient temperature of the quantum dots 20 follows a rise of the atmospheric temperature, as depicted in FIG. 4, until the atmospheric temperature rises from the temperature T0 to the temperature TA. However, when the ambient temperature of the quantum dots 20 rises up to the temperature TA and one of the melting of the ligand 18 and the evaporation of the first solvent 32 begins, the ambient temperature of the quantum dots 20 maintains the temperature TA for a while.

By further carrying on the heating of the atmosphere, one of the melting of the ligand 18 and the evaporation of the first solvent 32 ends, and the ambient temperature of the quantum dots 20 begins to rise again. Then, when the ambient temperature of the quantum dots 20 rises up to the first temperature T1 and the other one of the melting of the ligand 18 and the evaporation of the first solvent 32 begins, the ambient temperature of the quantum dots 20 maintains the first temperature T1 for a while.

Thus, the melting of the ligand 18 and the evaporation of the first solvent 32 are completed by the step of the first heating. When the first temperature T1 is the boiling point of the first solvent 32, in the step of the first heating, the first solvent 32 vaporizes after the ligand 18 has melted. On the other hand, when the first temperature T1 is the melting point of the ligand 18, in the step of the first heating, the ligand 18 melts after the first solvent 32 has vaporized.

In a case where the melting of the ligand 18 is earlier than the vaporization of the first solvent 32, immediately after the vaporization of the first solvent 32, aggregate of the quantum dots 20, around which the solid ligand 18 is attached, is formed in an upper layer relative to the first charge transport layer 6. Since the aggregate is unstable as a film, it is difficult for the first inorganic precursor 30 to be present in some case. Accordingly, in the step of the first heating, from the perspective of forming a stable film including the quantum dots 20 and the first inorganic precursor 30, it is preferable that the first solvent 32 vaporizes after the melting of the ligand 18.

Figure 6A:
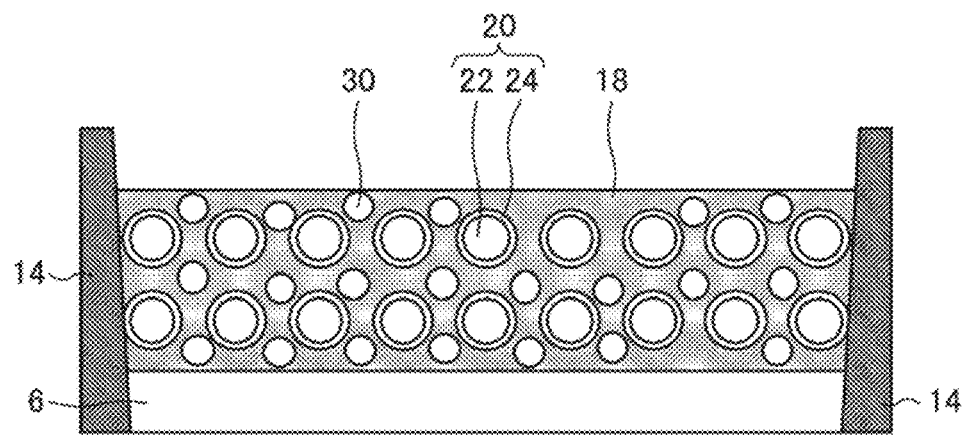
FIG. 6A is a cross-sectional view of the substrate in which a solvent of the first solution in FIG. 5B is vaporized.

After the completion of the step of the first heating, as illustrated in FIG. 6A, the first solvent 32 has vaporized from above the array substrate 3, and the quantum dots 20 and the first inorganic precursor 30 are dispersed in the melted ligand 18.

Subsequently, the heating of the atmosphere is continued until the atmospheric temperature reaches a second temperature T2 indicated in FIG. 4. From the point in time when the atmospheric temperature reaches the second temperature T2, a step of second heating is performed in which heating conditions are adjusted to maintain the atmospheric temperature at approximately the second temperature T2 (step S12).

After the completion of the melting of the ligand 18 and the evaporation of the first solvent 32, the ambient temperature of the quantum dots 20 rises from the first temperature T1 and reaches the second temperature T2. Since the atmospheric temperature is maintained at the second temperature T2, the ambient temperature of the quantum dots 20 having reached the second temperature T2 is also maintained at the second temperature T2.

Figure 6B:
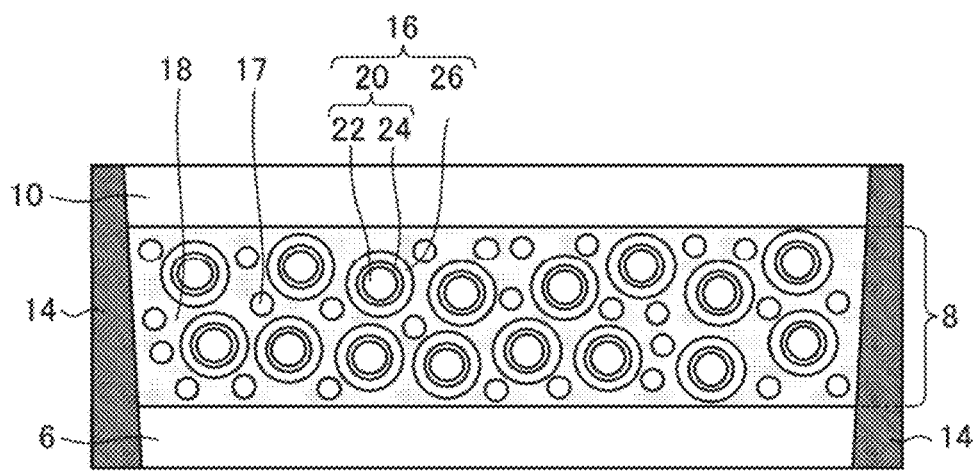
FIG. 6B is a cross-sectional view of the substrate on which the light-emitting layer according to the first embodiment is formed.

The second temperature T2 is higher than the first temperature T1, and is a temperature at which the first inorganic precursor 30 epitaxially grows around the first shell 24 by thermochemical reaction. Thus, while the ambient temperature of the quantum dots 20 is maintained at the second temperature T2 the first inorganic precursor 30 gradually grows epitaxially around the first shell 24. With this, the second shell 26 is formed around the first shell 24 of each quantum dot 20, as illustrated in FIG. 6B. Further, the first inorganic precursor 30 remaining in the ligand 18 becomes the second quantum dot 17 made of the same material as the second shell 26 in the ligand 18. That is, the second quantum dot 17 is formed of the first inorganic precursor 30. When the first inorganic precursor 30 contains zinc chloride and 1-Dodecanethiol as discussed above, the second temperature T2 is approximately 200 degrees Celsius.

As described above, as illustrated in FIG. 6B, the first quantum dot 16 including the quantum dot 20 and the second shell 26 is formed. Then, after the atmospheric temperature has reached a temperature at approximately the second temperature T2 (step S12), a step of temperature lowering is performed in which the atmospheric temperature is reduced from the second temperature T2 (step S13A). In the step of the temperature lowering, for example, the array substrate 3 is removed from the furnace and cooled. In this way, the melted ligand 18 is solidified again. Then, the light-emitting layer 8 illustrated in FIG. 6B including the first quantum dot 16, the second quantum dot 17, and the ligand 18 is obtained. The second quantum dot 17 contains, in the core, the same material as the second shell 26. For example, the second quantum dot 17 is not a quantum dot (quantum dot of a core-shell type) including a shell epitaxially growing around a core, and is a quantum dot (quantum dot of a core type) that does not include a shell epitaxially growing around a core and is substantially formed of only a core.

When the period (the period in step S12) for maintaining the atmospheric temperature at the second temperature T2 is increased, a decrease in luminous efficiency may be caused by adjacent first quantum dots 16 connected to each other, or the first quantum dot 16 and the second quantum dot 17 connected to each other. Thus, the period (the period in step S12) for maintaining the atmospheric temperature at the second temperature T2 is preferably a period of time as short as possible. For example, the step of the temperature lowering may be started so as to reduce a temperature from the second temperature T2 while the first inorganic precursor 30 is epitaxially growing around the first shell 24 after the step of the second heating. In this way, adjacent first quantum dots 16 can be separated from each other. That is, a state where adjacent quantum dots 20 are not connected to each other via the second shell 26 can be obtained. Further, the first quantum dot 16 and the second quantum dot 17 can be separated from each other. That is, a state where the quantum dot 20 is not connected to the second quantum dot 17 via the second shell 26 can be obtained. In this way, a decrease in luminous efficiency due to adjacent first quantum dots 16 connected to each other, or the first quantum dot 16 and the second quantum dot 17 connected to each other can be suppressed.

Further, for example, when the second quantum dot 17 is formed by using a semiconductor material having a band gap of less than 3.1 eV (for example, CdS:Eg=2.4 eV), the period (the period in step S12) for maintaining the atmospheric temperature at the second temperature T2 is preferably adjusted such that a particle diameter (diameter) is equal to or less than 2 nm. In this way, a decrease in color purity of the luminescent color of the light-emitting layer 8 due to the luminescent color of the second quantum dot 17 can be suppressed.

Note that in the present embodiment, the step of forming the light-emitting layer 8 is described with reference to the enlarged cross-sectional view of the periphery of the second light-emitting layer 8G. However, a difference in the forming method of each of the first light-emitting layer 8R, second light-emitting layer 8G, and third light-emitting layer 8B is only a difference in the materials contained in the first solution 28. That is, regardless of luminescent colors of the light-emitting layer 8 to be formed, the steps of the first application, the first heating, and the second heating may be implemented by the same method.

In the step of the first application, the material contained in the first solution 28 may be changed for each luminescent color of the corresponding light-emitting element, the first solution 28 may be subjected to separately patterning by an ink-jet method, and then the steps of the first heating and second heating described above may be performed. As a result, the light-emitting elements having mutually different luminescent colors can be formed by continuous single heating.

Next, the second charge transport layer 10 is formed (step S6). The second charge transport layer 10 may be applied and formed in common to all of the subpixels by a spin coat technique or the like.

Finally, the second electrode 12 is formed (step S7). The second electrode 12 may be film-formed in common to all of the subpixels by vapor deposition or the like. As described above, the light-emitting element layer 2 is formed on the array substrate 3, and the light-emitting device 1 illustrated in FIGS. 1A to 1C is obtained.

In the method for manufacturing the light-emitting device 1 according to the present embodiment, after the quantum dot 20 having the core/shell structure is applied, the second shell 26 epitaxially grows around the first shell 24 of each quantum dot 20. Thus, a film thickness of the shell in each quantum dot 20 can be made thicker than that when the quantum dots 20 having the core/shell structure are simply layered.

For example, in a quantum dot having the core/shell structure, it is conceivable to increase a film thickness of a shell in order to reduce exudation of electrons injected into the core of the quantum dot. However, when quantum dots having a thick film thickness of a shell are layered to form quantum dots, a filling rate of the quantum dots is low with respect to the volume of a light-emitting layer. Thus, it is difficult to achieve sufficient density of the quantum dots in the light-emitting layer, resulting in a decrease in luminous efficiency of a light-emitting element.

In the method for manufacturing the light-emitting device 1 according to the present embodiment, the quantum dot 20 including a thin first shell 24 is applied, and the second shell 26 is then formed on each quantum dot 20. In the light-emitting layer 8 according to the present embodiment, a film thickness of the shell formed around the core 22 can be considered as a total film thickness of the first shell 24 and the second shell 26.

As a result, the density of the quantum dots 20 in the light-emitting layer 8 can be enhanced compared to the case of simply layering the quantum dots provided with the shells having the same film thickness. Thus, while reducing the electron exudation from the quantum dot 20, the density of the quantum dots 20 in the light-emitting layer 8 is improved, thereby resulting in an improvement in luminous efficiency of the light-emitting device 1.

In the present embodiment, since at least one set of quantum dots 20 is connected via the second shell 26, an area of the outer surface of the second shell 26 is smaller in the above one set of quantum dots 20 than that in the case of not being connected. That is, in the present embodiment, an area of the outer surface of the first quantum dot 16 can be reduced compared to the case of simply layering quantum dots.

By reducing the area of the outer surface of the first quantum dot 16, the area of the surface of the second shell 26, through which moisture may infiltrate from the outside, can be reduced. Accordingly, this configuration may reduce damage to the second shell 26 due to the moisture infiltration, and may consequently suppress degradation in a surface protection function of the quantum dot 20 of the second shell 26 due to the damage described above.

When the ligand 18 coordinates on the outer surface of the first quantum dot 16, the reduction of the area of the outer surface makes it possible to reduce the ligand 18 possible to be damaged by the moisture infiltration. Accordingly, it is possible to reduce the damage to the second shell 26 due to the loss of the protection function by the ligand 18 for the second shell 26 due to the damage described above.

By reducing the area of the outer surface of the first quantum dot 16, it is possible to reduce the surface area of the second shell 26 possible to be damaged when the light-emitting device 1 is driven. Thus, the above-discussed configuration may reduce damage to the second shell 26 accompanying the drive of the light-emitting device 1, and may consequently reduce the formation of defects in the second shell 26 due to the damage. As a result, by reducing the area of the outer surface of the first quantum dot 16, the occurrence of a non-emitting process caused by recombination of electrons and holes in the defects is suppressed, and consequently a decrease in luminous efficiency of the light-emitting device 1 is suppressed.

As described above, because of the outer surface of the first quantum dot 16 being small, it is possible to reduce the area of the outer surface of the first quantum dot 16 possible to be damaged, and reduce deactivation of the quantum dot 20 due to damage to the first quantum dot 16.

According to NPL 1, the average value of a random close packing ratio in the packing of rigid spheres is approximately 63.66 percent. Accordingly, in the present embodiment, the proportion of the volume of the first quantum dots 16 in the light-emitting layer 8 is preferably greater than or equal to 63.7 percent. With the above configuration, the density of the quantum dots 20 in the light-emitting layer 8 can be enhanced compared to the case of randomly layering quantum dots each provided with a shell whose film thickness is equal to the total film thickness of the first shell 24 and second shell 26. Furthermore, with the configuration described above, it is possible to more efficiently decrease the area of the outer surface of the first quantum dot 16 compared to the case of randomly layering quantum dots.

Conditions required to connect all of the quantum dots 20 in the first quantum dots 16 via the second shells 26 will now be described.

It is assumed that the quantum dots 20 are arranged in an array of m rows and n columns on a plane. Positions where adjacent quantum dots 20 can be connected, that is, the number of positions between lattice points arranged in the array of in rows and n columns is obtained by an equation of $m \times (n-1) + n \times (m-1) = 2mn - m - n$.

It is also assumed that, in a case where all of the quantum dots 20 on the same plane are connected via the second shells 26, the number of sets of mutually connected quantum dots 20 is assumed to be minimal. As one example of this case, an example is cited in which all the sets of adjacent quantum dots are connected in all the in-between positions of the rows, and any one set of adjacent quantum dots is connected to each other in each of all the in-between positions of the columns. In this case, the number of positions where the adjacent quantum dots 20 are connected is obtained by an equation of $m \times (n-1) + 1 \times (m-1) = mn - 1$.

Accordingly, in the case of the above-discussed conditions, the proportion of the positions where the quantum dots 20 are actually connected to each other via the second shells 26 to the positions where all the quantum dots 20 can be connected via the second shells 26 is expressed by a relation of $(mn-1)/(2mn-m-n)$.

The number of quantum dots 20 included in the light-emitting layer 8 of the actual light-emitting device 1 is significantly large, and therefore it is possible to consider that both m and n are sufficiently great. Thus, when m and n positively diverge, the above-mentioned proportion can be derived to be approximately 0.5.

Therefore, in the case where all of the quantum dots 20 on the same plane are connected via the second shells 26, and among all of the sets of adjacent quantum dots 20, the number of sets thereof being connected via the second shells 26 is minimal, these sets may be considered to be approximately 50 percent of all of the sets. Accordingly, in the case where, among all of the sets of adjacent quantum dots 20, the sets thereof connected via the second shells 26 exceeds 50 percent, it can be said that there is a high probability that all the quantum dots 20 in each of the layers being layered are connected via the second shells 26.

In the case where all the quantum dots 20 are connected via the second shells 26, when the quantum dot 20 is assumed to be one atom, it can be assumed that the first quantum dot 16 forms a crystal structure in which the quantum dots 20 are connected to each other by the second shells 26. The above configuration may more efficiently decrease the area of the outer surface of the first quantum dot 16. Therefore, in the first quantum dots 16, it is preferable for the ratio of the adjacent quantum dots 20 being connected to each other by the crystal structure of the second shells 26 to be greater than 50 percent and less than or equal to 100 percent.

In the present embodiment, an average film thickness of the first shell 24 from the outer surface of the core 22 is less than a minimum film thickness of the second shell 26. Thus, the quantum dots 20 can be more densely layered between the step of the first heating and the step of the second heating, and the second shell 26 having a relatively thick film thickness can be formed in the subsequent step of the second heating.

Therefore, in the heating step, it is possible to form the first shell 24 and the second shell 26 having a film thickness that can sufficiently reduce the electron exudation from the core 22, derived from the electron wave function, while the quantum dots 20 are densely layered. Thus, according to this configuration, the density of the quantum dots 20 in the first quantum dots 16 can be increased while sufficiently ensuring a film thickness of the first shell 24 and the second shell 26.

In the present embodiment, the light-emitting layer 8 is formed after the formation of the array substrate 3, the first electrode 4, the edge covers 14, and the first charge transport layer 6. Therefore, it is preferable that the array substrate 3, the first electrode 4, the edge covers 14, and the first charge transport layer 6 contain a material having heat resistance with respect to heating in the above-mentioned heating steps.

The array substrate 3 may be, for example, a glass substrate containing alkali glass or the like having a sufficiently high strain point. Further, the array substrate 3 may be an organic substrate containing an organic material having a high glass-transition temperature, such as polyimide.

For example, when the light-emitting element layer 2 forms a bottom-emitting type light-emitting element and the first electrode 4 is an anode electrode, ITO is commonly used for the first electrode 4. However, in order to suppress an increase in specific resistance due to heating in the above-mentioned heating steps, the first electrode 4 preferably includes a material having high heat resistance such as a composite material of FTO and ITO. When the first charge transport layer 6 is a hole transport layer, it is preferable to contain an inorganic material having higher heat resistance than an organic material, such as NiO, MgNiO, $Cr_2O_3$, $Cu_2O$, or $LiNbO_3$.

In order to achieve a shape having a certain level of height and inclination, an organic material is generally used for the edge cover 14. In the present embodiment, from the perspective of reducing damage caused by heating in the above-mentioned heating steps, the edge cover 14 preferably contains an organic material having a high glass-transition temperature, such as polyimide.

The second charge transport layer 10 and the second electrode 12 are formed after the light-emitting layer 8 is formed. Accordingly, a material not having heat resistance against the heating in the above-mentioned heating steps can be employed for the material of the second charge transport layer 10 and the second electrode 12. For example, the second charge transport layer 10 may contain a material used for a known electron transport layer in the related art, and the second electrode 12 may contain a material used for a known cathode electrode in the related art.

Second Embodiment

Figure 7A:
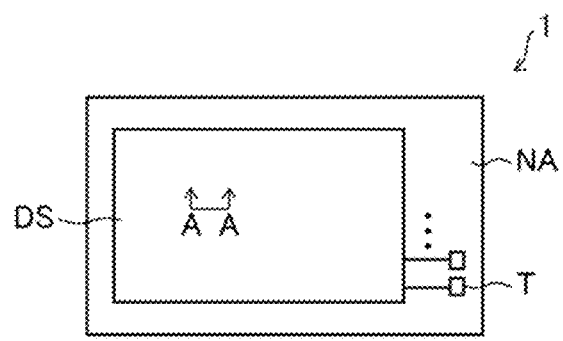
FIG. 7A is a schematic top view of a light-emitting device according to a second embodiment.
Figure 7B:
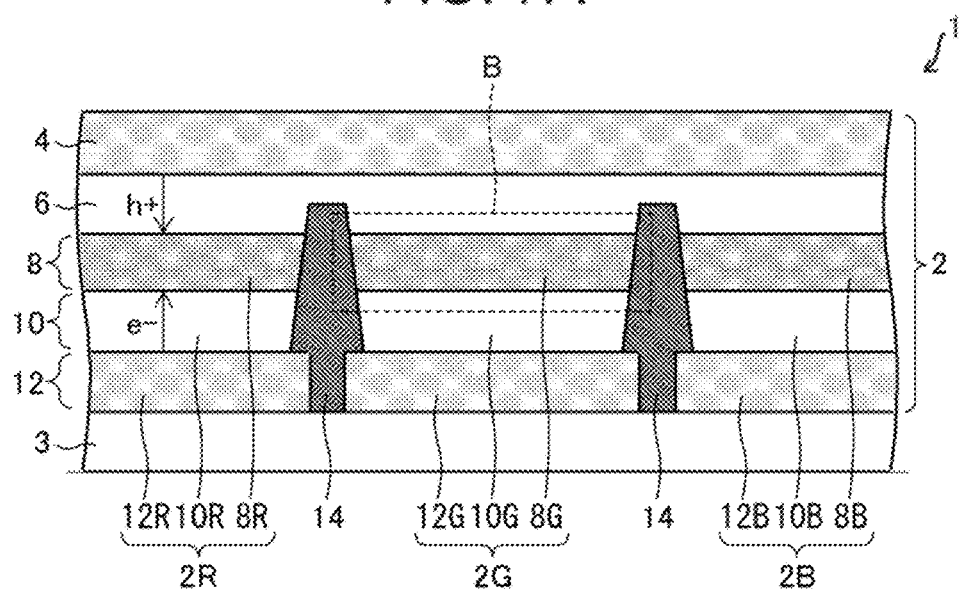
FIG. 7B is a cross-sectional view taken along a line A-A in FIG. 7A.
Figure 7C:
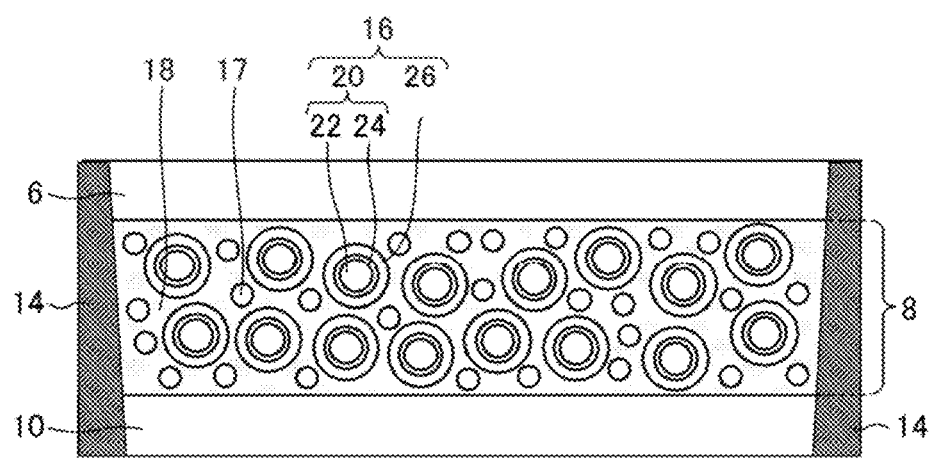
FIG. 7C is an enlarged cross-sectional view of a region B in FIG. 7B.

FIG. 7A is a schematic top view of a light-emitting device 1 according to the present embodiment. FIG. 7B is a cross-sectional view taken along a line A-A in FIG. 7A. FIG. 7C is an enlarged cross-sectional view of a region B in FIG. 7B.

The light-emitting device 1 according to the present embodiment may have the same configuration as that of the light-emitting device 1 according to the previous embodiment except that the layering order of each of the layers in a light-emitting element layer 2 is reversed. In other words, the light-emitting element layer 2 according to the present embodiment includes a second charge transport layer 10, a light-emitting layer 8, a first charge transport layer 6, and a first electrode 4, which are sequentially layered from the lower layer on a second electrode 12.

In comparison with the light-emitting device 1 according to the previous embodiment, each of the second electrode 12 and the second charge transport layer 10 is separated by edge covers 14. In particular, in the present embodiment, the second electrode 12 is, by the edge covers 14, separated into a second electrode 12R for a first light-emitting element 2R, a second electrode 12G for a second light-emitting element 2G, and a second electrode 12B for a third light-emitting element 2B. Further, the second charge transport layer 10 is, by the edge covers 14, separated into a second charge transport layer 10R for the first light-emitting element 2R, a second charge transport layer 10G for the second light-emitting element 2G, and a second charge transport layer 10B for the third light-emitting element 2B.

In comparison with the light-emitting device 1 according to the previous embodiment, the first charge transport layer 6 and the first electrode 4 are not separated by the edge covers 14, and are each formed in a shared manner.

In the present embodiment, the first electrode 4 may be a transparent electrode and the second electrode 12 may be a reflective electrode. Therefore, light from the light-emitting layer 8 passes through the first charge transport layer 6 and the first electrode 4, and is emitted from a light-emitting face DS to the outside of the light-emitting device 1. Due to this, the light-emitting device 1 is configured as a top-emitting type light-emitting device. Because of this, in the present embodiment, an array substrate 3 need not necessarily be a transparent substrate.

The light-emitting device 1 according to the present embodiment can be manufactured by performing each of the steps illustrated in FIG. 2 in the order of step S1, step S7, step S3, step S6, step S5, step S4, and step S2 in a similar manner to that of the previous embodiment. Thus, in the present embodiment, the light-emitting layer S is formed after the formation of the array substrate 3, the second electrode 12, the edge covers 14, and the second charge transport layer 10. Therefore, it is preferable that the array substrate 3, the second electrode 12, the edge covers 14, and the second charge transport layer 10 contain a material having heat resistance with respect to heating in the above-mentioned heating step.

For example, when the light-emitting element layer 2 forms a top-emitting type light-emitting element and the second electrode 12 is a cathode electrode, the second electrode 12 preferably contains a metal material with a high melting point from the perspective of enhancing heat resistance with respect to heating in the heating step described above. For example, it is preferable for the second electrode 12 to contain a metal such as Al or Ag, or an intermetallic compound such as AgMg. When the second charge transport layer 10 is an electron transport layer, it is preferable to contain an inorganic material having higher heat resistance than an organic material, such as MgO. The materials described above are also materials used as a cathode electrode material and an electron transport layer material in general.

The first charge transport layer 6 and the first electrode 4 are formed after the light-emitting layer 8 is formed. Accordingly, a material not having heat resistance against the heating in the above-mentioned heating step can be employed for the material of the first charge transport layer 6 and the first electrode 4. For example, the first charge transport layer 6 may contain a material used for a known hole transport layer in the related art, and the first electrode 4 may contain a transparent conductive material used for a known anode electrode, such as ITO in the related art.

The light-emitting device 1 according to the present embodiment has a low level of necessity to change the materials of each layer in the light-emitting element layer 2 in comparison with the light-emitting device 1 according to the previous embodiment. Accordingly, the light-emitting device 1 according to the present embodiment can improve the degree of freedom in material selection in comparison with the light-emitting device 1 according to the previous embodiment.

Third Embodiment

Figure 8A:
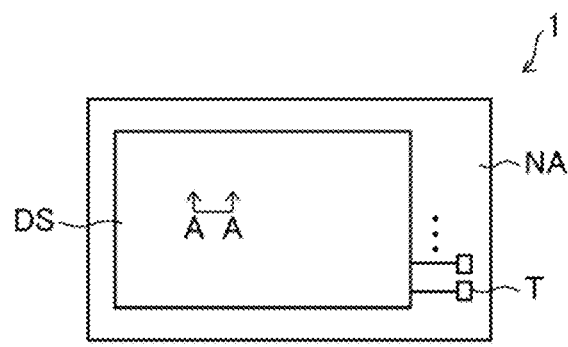
FIG. 8A is a schematic top view of a light-emitting device according to a third embodiment.
Figure 8B:
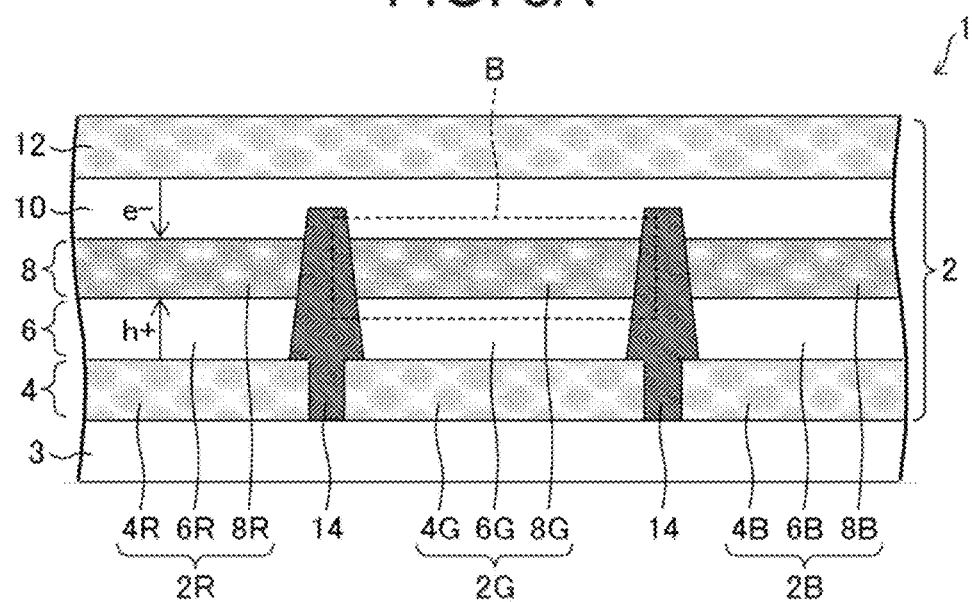
FIG. 8B is a cross-sectional view taken along a line A-A in FIG. 8A.
Figure 8C:
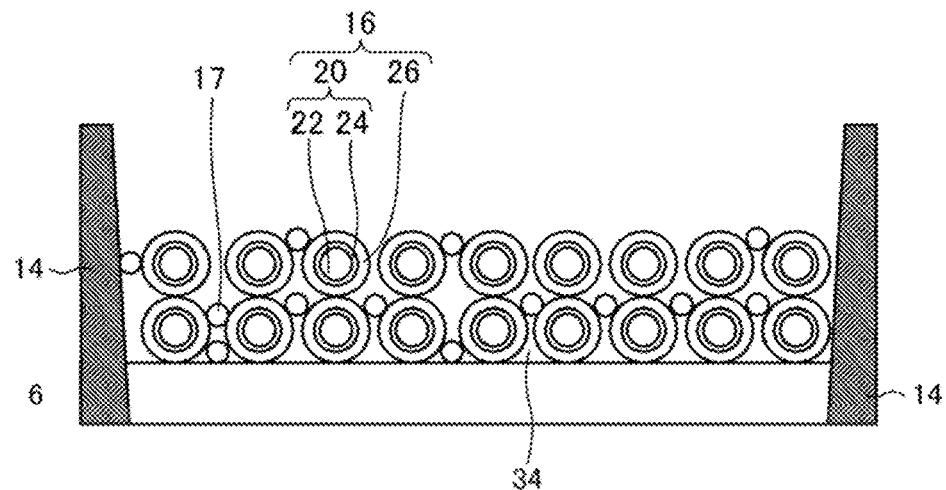
FIG. 8C is an enlarged cross-sectional view of a region B in FIG. 8B.

FIG. 8A is a schematic top view of a light-emitting device 1 according to the present embodiment. FIG. 8B is a cross-sectional view taken along a line A-A in FIG. 8A. FIG. 8C is an enlarged cross-sectional view of a region B in FIG. 8B.

The light-emitting device 1 according to the present embodiment may have the same configuration as that of the light-emitting device 1 of the first embodiment except that a light-emitting layer 8 does not include a ligand 18. As illustrated in FIG. 8C, the light-emitting layer 8 may include a void 34 in a space not filled with a first quantum dot 16 and a second quantum dot 17.

The light-emitting device 1 according to the present embodiment is manufactured by the same method except for step S5, that is, the step of forming the light-emitting layer among the steps illustrated in FIG. 2. The step of forming the light-emitting layer of the light-emitting device 1 according to the present embodiment will be described in more detail with reference to FIGS. 9 to 11.

Figure 9:
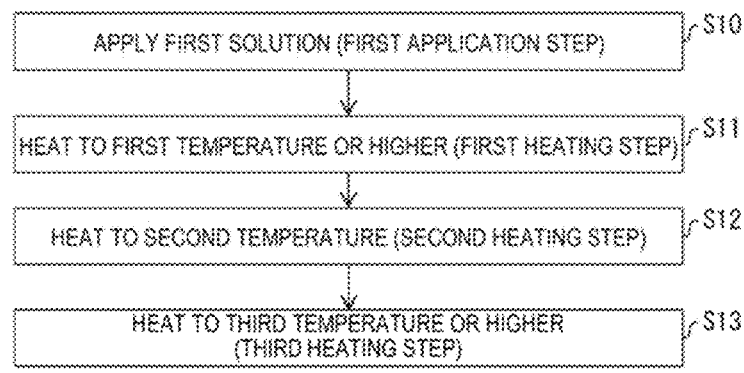
FIG. 9 is a flowchart for describing a step of forming a light-emitting layer according to the third embodiment.
Figure 10:
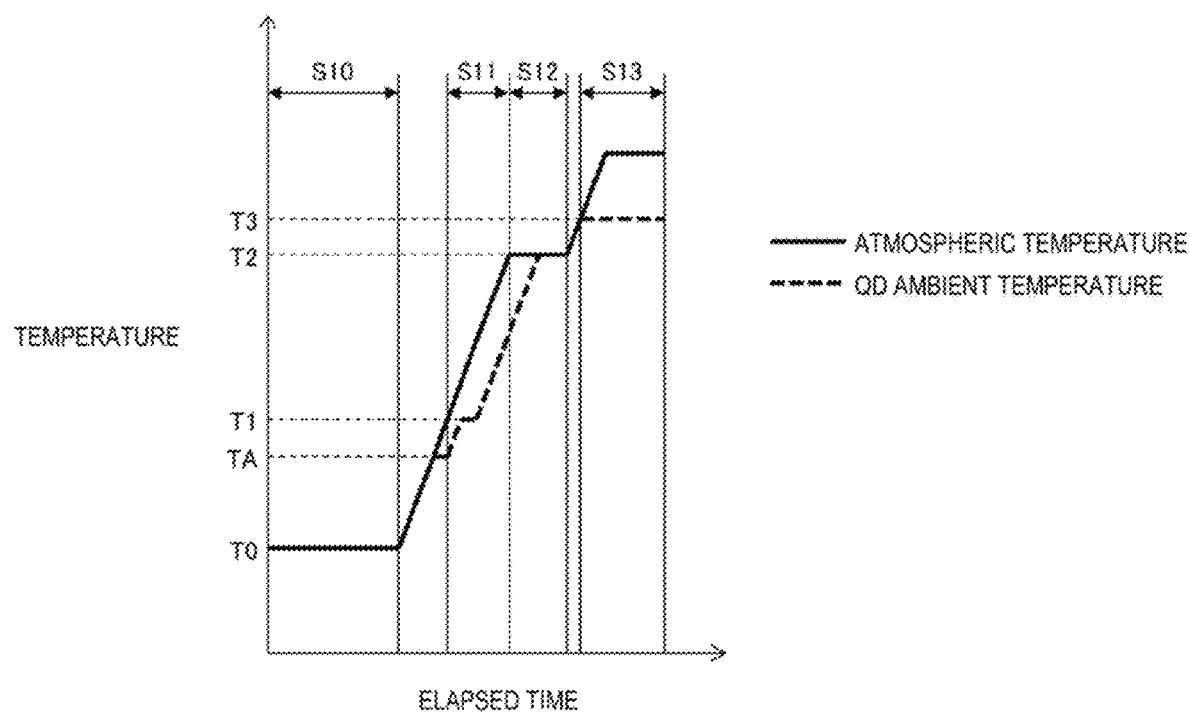
FIG. 10 is a graph for describing a relationship between an elapsed time and a temperature in a step of forming a light-emitting layer according to the third embodiment.

FIG. 9 is a flowchart for describing the step of forming the light-emitting layer corresponding to a step of forming a quantum dot layer in the present embodiment. FIG. 10 is a graph for describing a relationship between an elapsed time and a temperature in the step of forming the light-emitting layer. Similar to FIG. 4, a solid line in FIG. 10 indicates an atmospheric temperature around an array substrate 3, and a broken line indicates a temperature around a quantum dot 20 on the array substrate 3. FIG. 11 is a forming-step cross-sectional view for describing the step of forming the light-emitting layer.

Figure 11A:
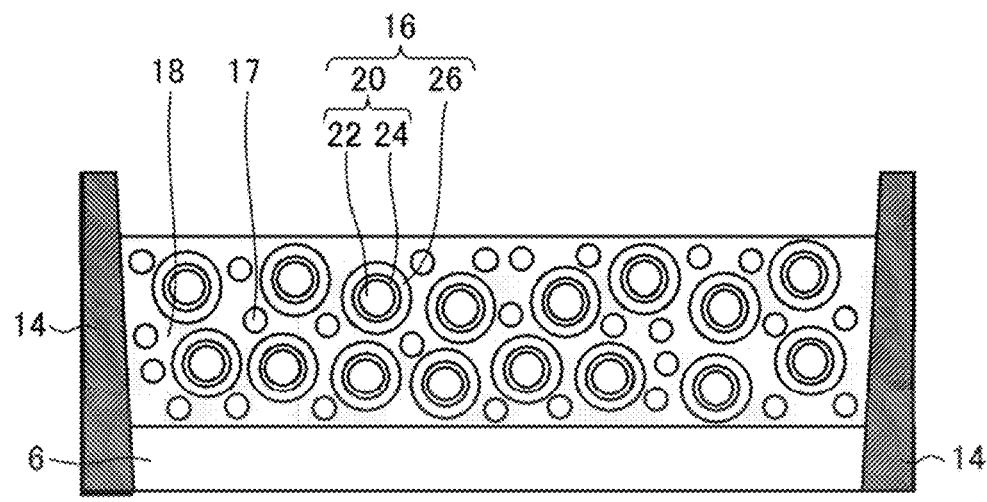
FIG. 11A is a cross-sectional view of a substrate completed up to step S12 according to the third embodiment.
Figure 11B:
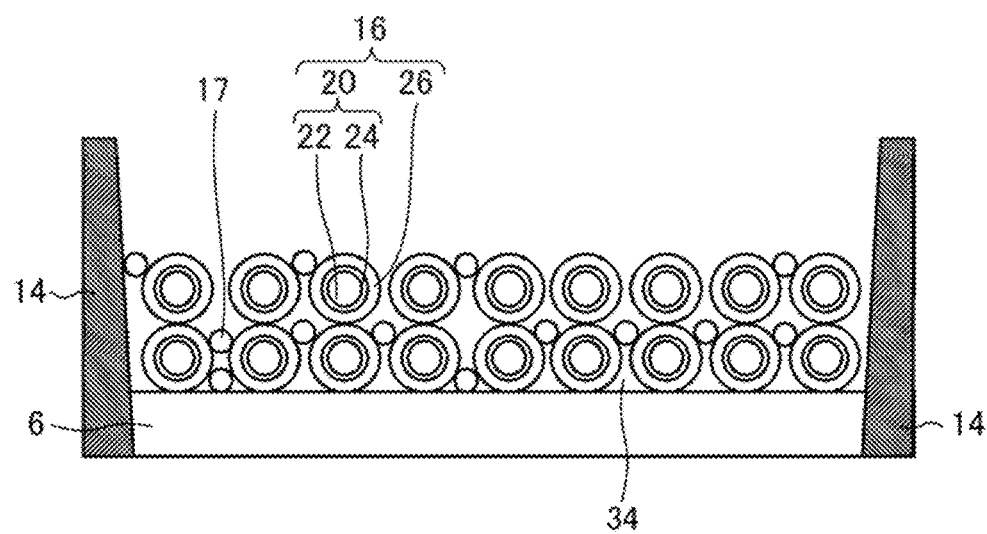
FIG. 11B is a cross-sectional view of a substrate in which a ligand is evaporated from the substrate illustrated in FIG. 11A.

In the step of forming the light-emitting layer according to the present embodiment, the same method as that described in the first embodiment is performed from step S10 to step S12. At the point in time of the completion of step S12, the first quantum dot 16, the second quantum dot 17, and the ligand 18 are formed in an upper layer relative to a first charge transport layer 6, as illustrated in FIG. 11A.

In the present embodiment, subsequent to step S12, a step of third heating is performed in which the atmosphere is heated so that the atmospheric temperature rises to reach a third temperature T3 or higher (step S13). The third temperature T3 is higher than the second temperature T2, and is equivalent to a boiling point of the ligand 18. For example, in the case where the ligand 18 is the aforementioned TOPO, the third temperature T3 is 411.2 degrees Celsius.

When the ambient temperature of the quantum dots 20 reaches the third temperature T3 by heating the atmosphere in the step of the third heating, evaporation of the ligand 18 begins and the ambient temperature of the quantum dots 20 maintains the third temperature T3 for a while. Thus, in the step of the third heating, the ligand 18 vaporizes, resulting in the light-emitting layer 8 without the ligand 18 as illustrated FIG. 11B.

The light-emitting device 1 according to the present embodiment does not include the ligand 18 in the light-emitting layer 8. Generally, a ligand that coordinates with quantum dots often includes an organic material. Thus, the light-emitting layer 8 according to the present embodiment that does not include the ligand 18 has a low content of an organic material with respect to an inorganic material, and is resistant to deterioration due to moisture permeation or the like. Therefore, the light-emitting device 1 according to the present embodiment can further improve reliability.

Here, from the description of NPL 1 described above, the average value of the proportion of the voids that are not occupied by rigid spheres in the randomly closest packed space of the rigid spheres is approximately 36.34 volume percent. Therefore, for example, a volume ratio of an organic matter to an inorganic matter in the light-emitting layer 8 is preferably equal to or less than 36.3 volume percent. In this case, a proportion of the organic matter in the light-emitting layer 8 can be reduced compared to a case of a light-emitting layer in which known quantum dots are randomly closest packed and a void between the quantum dots is filled with an organic ligand. Therefore, with the configuration described above, the reliability of the light-emitting layer 8 can be more efficiently improved.

Note that, in the present specification, expression of "not including a ligand" refers to not substantially including a ligand. For example, the light-emitting layer 8 in the present embodiment may have a residue of an impurities or ligands being left to the extent that the reliability of the light-emitting layer 8 is not significantly reduced. Specifically, the light-emitting layer 8 in the present embodiment may have a residue of the impurities or the ligands described above that is approximately 3 volume percent of the entire volume of the light-emitting layer 8.

Also in the present embodiment, similarly to the embodiments described above, the area of the outer surface of the first quantum dot 16 can be reduced. In this way, the surface area of the second shell 26 possible to be damaged by heating in the step of the third heating in the present embodiment can be reduced. Thus, with this configuration, as described above, formation of a defect in the second shell 26 due to damage to the second shell 26, and thus a decrease in luminous efficiency of the light-emitting device 1 due to the defect can be reduced.

Fourth Embodiment

Figure 12A:
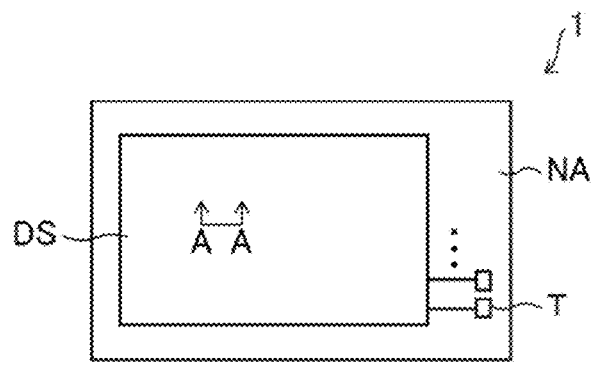
FIG. 12A is a schematic top view of a light-emitting device according to a fourth embodiment.
Figure 12B:
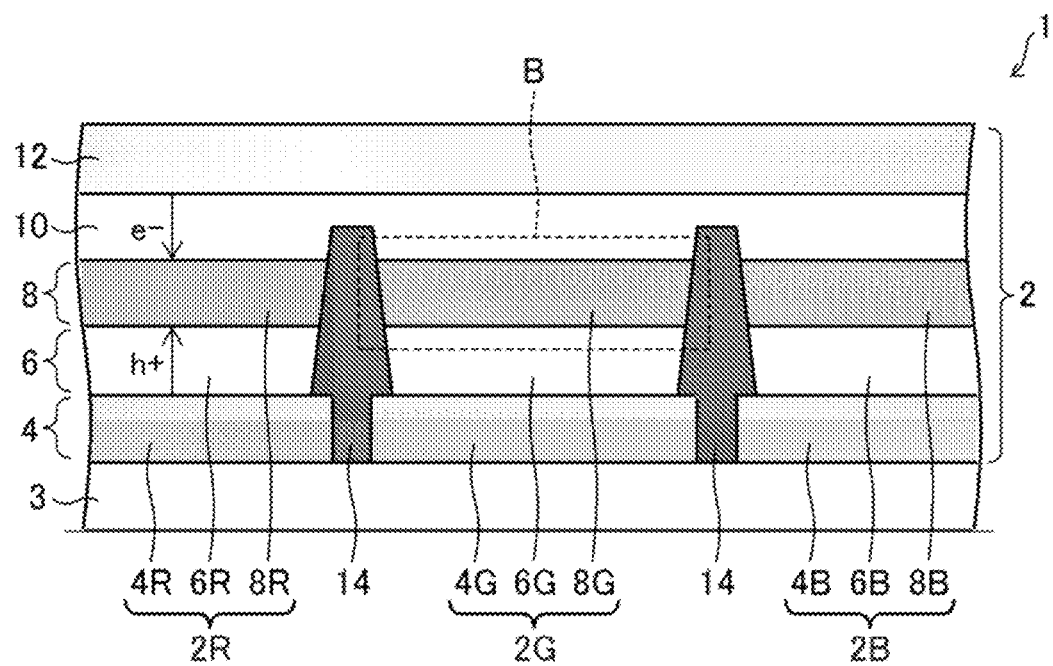
FIG. 12B is a cross-sectional view taken along a line A-A in FIG. 12A.
Figure 12C:
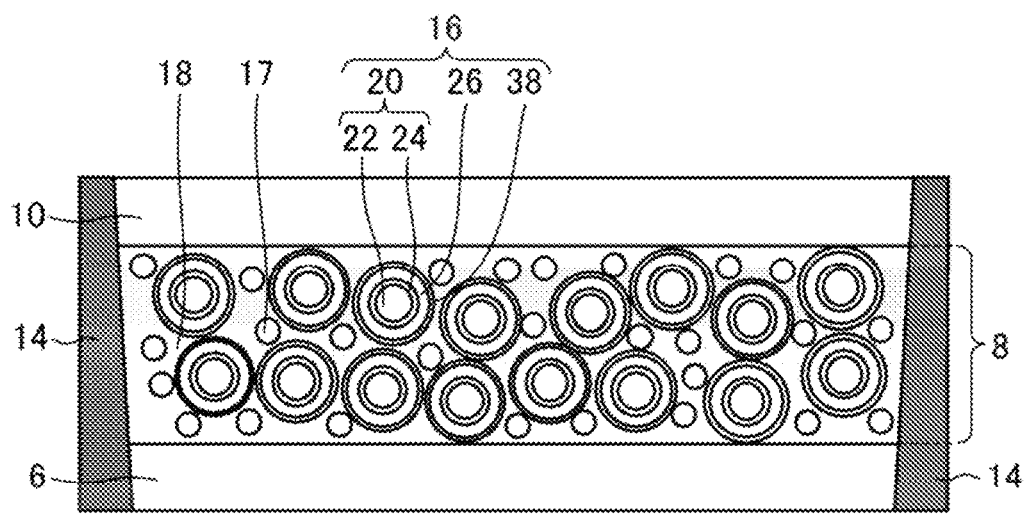
FIG. 12C is an enlarged cross-sectional view of a region B in FIG. 12B.

FIG. 12A is a schematic top view of a light-emitting device 1 according to the present embodiment. FIG. 12B is a cross-sectional view taken along a line A-A in FIG. 12A. FIG. 12C is an enlarged cross-sectional view of a region B in FIG. 12B.

The light-emitting device 1 according to the present embodiment may have the same configuration as that of the light-emitting device 1 according to the previous embodiments except that a first quantum dot 16 in a light-emitting layer 8 is different.

As illustrated in FIG. 12C, the first quantum dot 16 further includes a third shell 38 in addition to a quantum dot 20 and a second shell 26. Note that a plurality of the first quantum dots 16 may be connected to each other by a crystal structure of the third shell 38 to form an integral quantum dot structure.

The third shell 38 is formed around the second shell 26. The third shell 38 may include the same material as the second shell 26, and may include an inorganic shell material used for the quantum dots of a known core/shell structure.

The light-emitting device 1 according to the present embodiment is manufactured by the same method except for step S5, that is, the step of forming the light-emitting layer among the steps illustrated in FIG. 2. The step of forming the light-emitting layer of the light-emitting device 1 according to the present embodiment will be described in more detail with reference to FIGS. 13 to 17.

Figure 13:
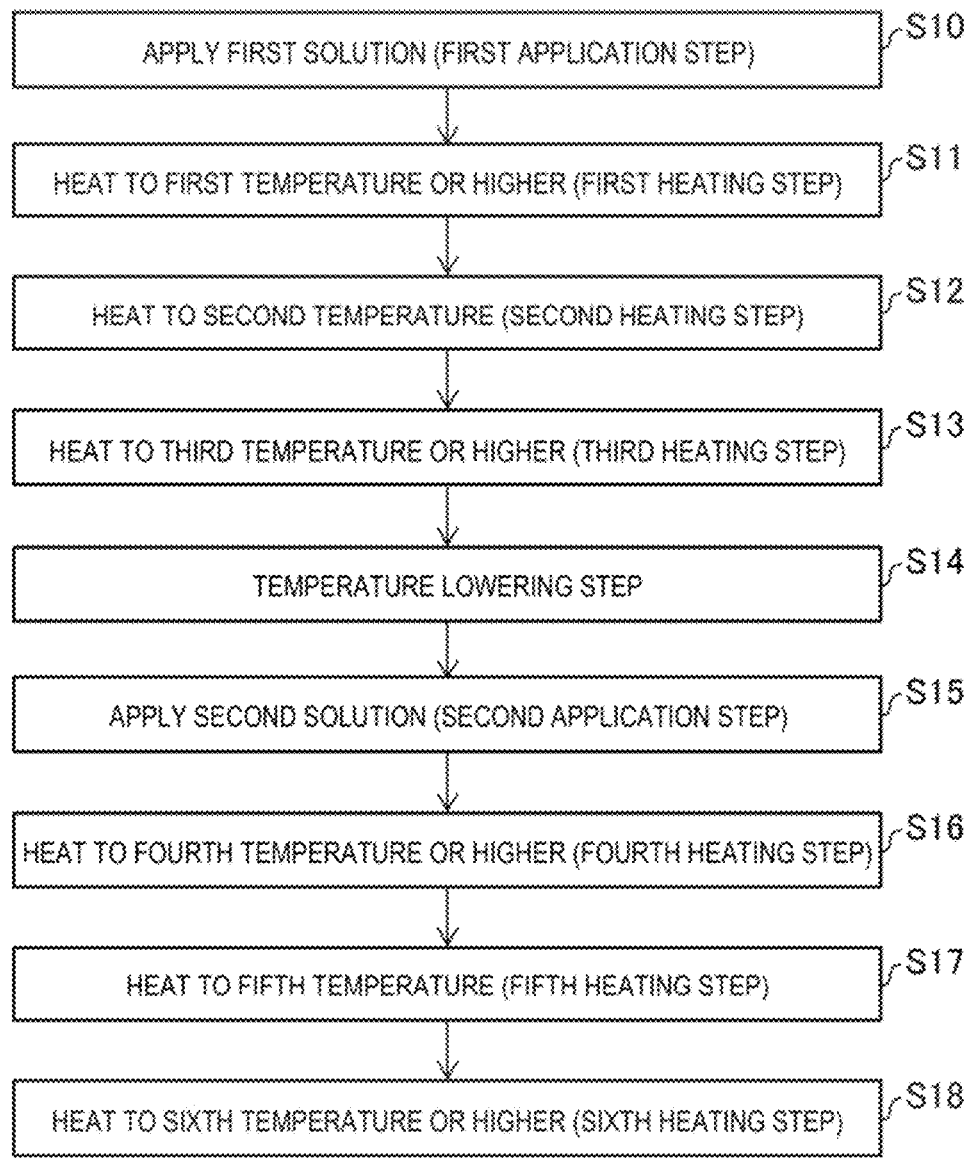
FIG. 13 is a flowchart for describing a method for manufacturing the light-emitting device according to the fourth embodiment.
Figure 14:
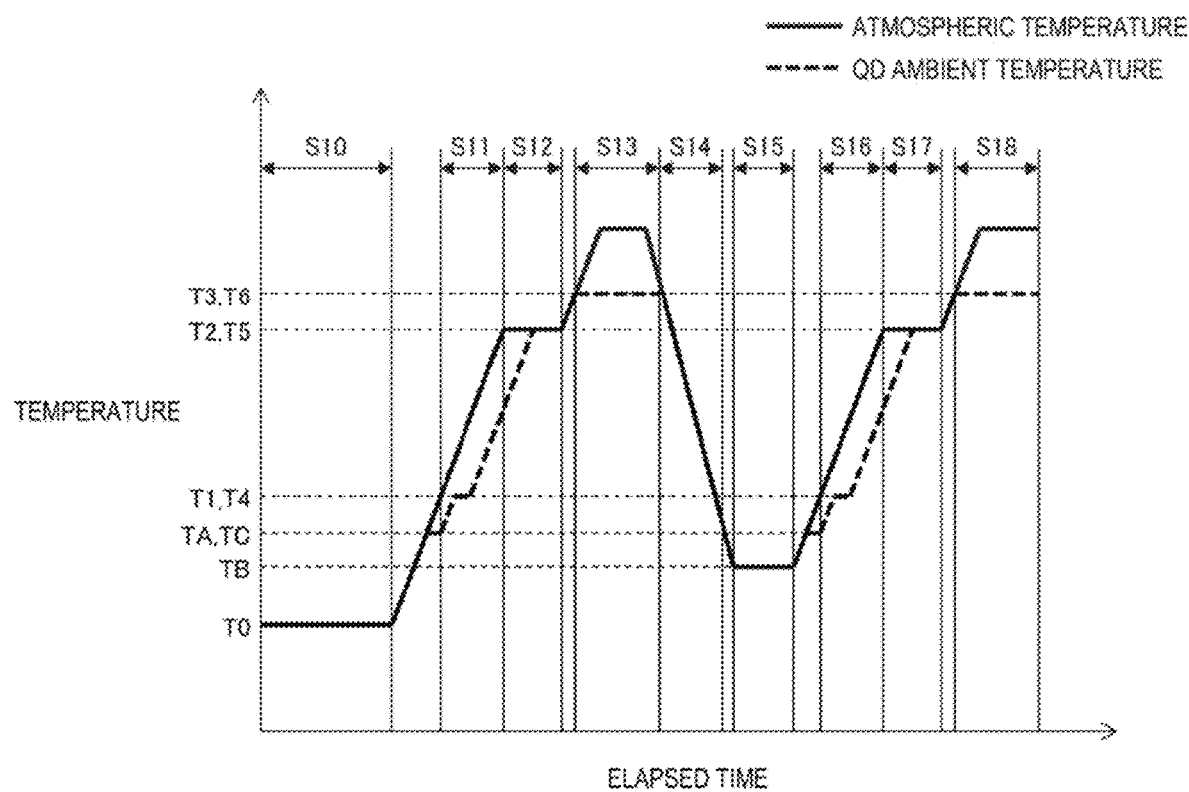
FIG. 14 is a graph for describing a relationship between an elapsed time and a temperature in a step of forming the light-emitting layer according to the fourth embodiment.
Figure 16A:
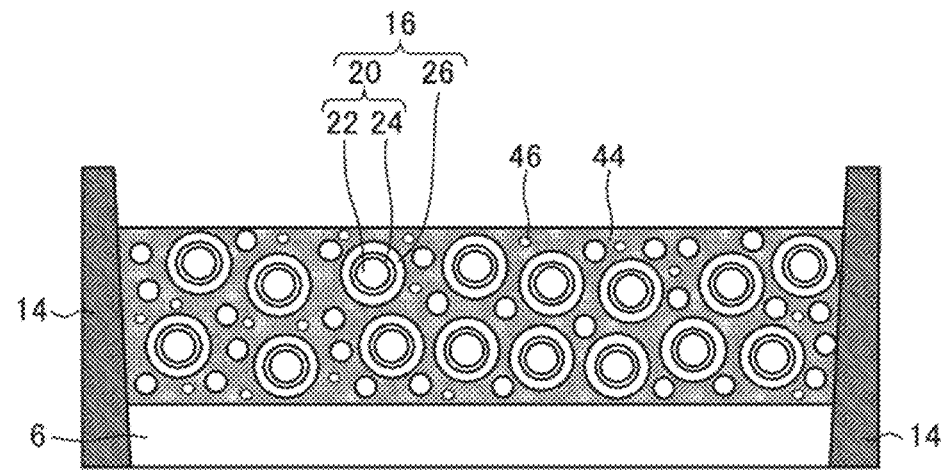
FIG. 16A is a cross-sectional view of a substrate in which a second solvent is vaporized from the second solution illustrated in FIG. 15B.
Figure 16B:
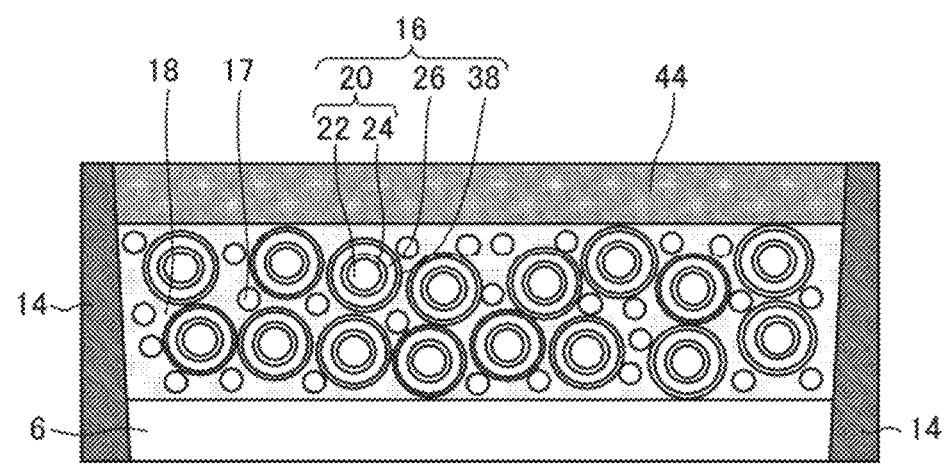
FIG. 16B is a cross-sectional view of a substrate in which a first quantum dot is formed according to the fourth embodiment.
Figure 17:
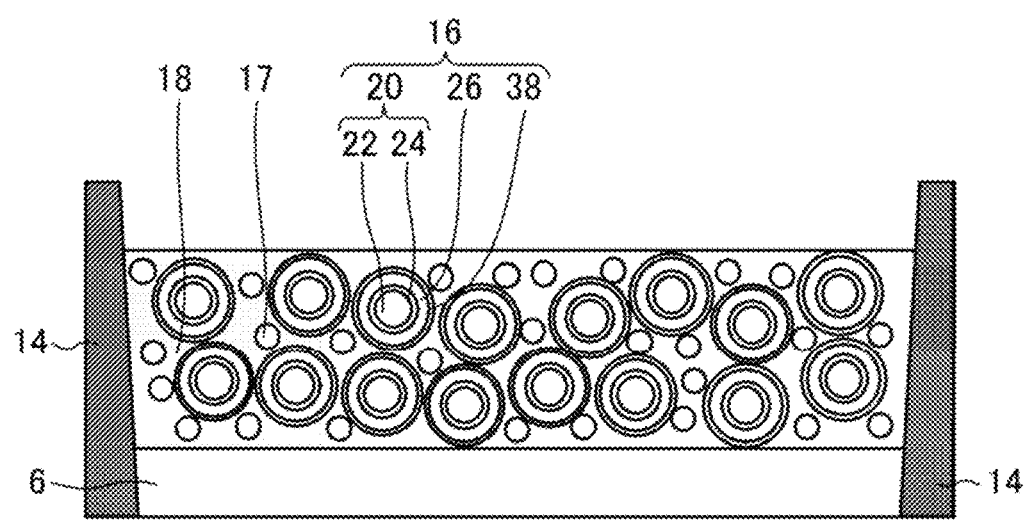
FIG. 17 is a cross-sectional view of a substrate in which the step of forming the light-emitting layer is completed according to the fourth embodiment.

FIG. 13 is a flowchart for describing the step of forming the light-emitting layer corresponding to a step of forming a quantum dot layer in the present embodiment. FIG. 14 is a graph for describing a relationship between an elapsed time and a temperature in the step of forming the light-emitting layer. Similar to FIG. 4, a solid line in FIG. 14 indicates an atmospheric temperature around an array substrate 3, and a broken line indicates a temperature around the quantum dot 20 on the array substrate 3. FIGS. 15 to 17 are forming-step cross-sectional views for describing the step of forming the light-emitting layer.

In the step of forming the light-emitting layer according to the present embodiment, the same method as that described in the previous embodiment is performed from step S10 to step S13. In the present embodiment, subsequent to step S13, a step of temperature lowering is performed in which the atmospheric temperature is lowered to a temperature lower than the third temperature T3 (step S14).

Figure 15A:
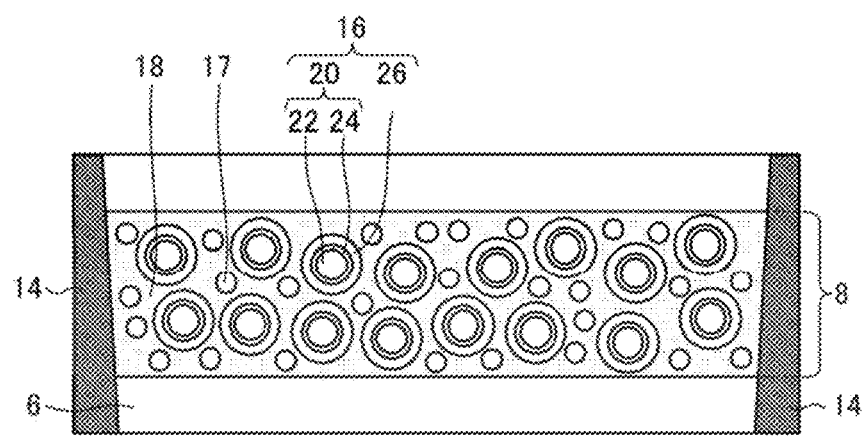
FIG. 15A is a cross-sectional view of a substrate completed up to step S14 according to the fourth embodiment.

In the present embodiment, with the step of the temperature lowering, cooling is performed until the atmospheric temperature becomes a temperature TB, which is lower than the temperature TA. The temperature TB may be higher than the temperature T0 or may be equal to the temperature T0. When the atmospheric temperature drops, the temperature around the quantum dots 20 also drops following the atmospheric temperature. At the point in time of the completion of the step of the temperature lowering, the first quantum dot 16 and a second quantum dot 17 are formed in an upper layer relative to a first charge transport layer 6, as illustrated in FIG. 15A.

Figure 15B:
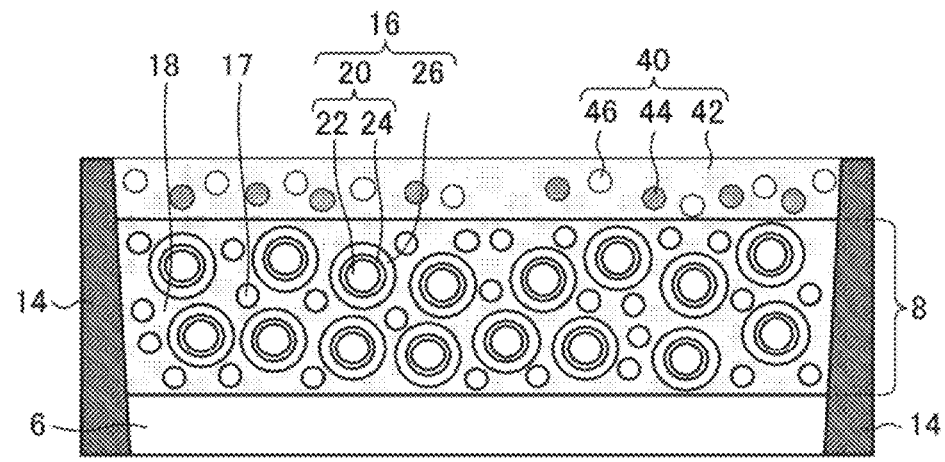
FIG. 15B is a cross-sectional view of a substrate in which a second solution is applied to the substrate illustrated in FIG. 15A.

After the atmospheric temperature has reached the temperature TB by the step of the temperature lowering, a step of second application is performed in which a second solution 40 is applied on a position overlapping with the array substrate 3 as illustrated in FIG. 15B (step S15). By the step of the second application, at least a part of voids in the periphery of the first quantum dot 16 may be filled with the second solution 40, as illustrated in FIG. 15B.

The second solution 40 contains a second solvent 42, an organic material 44, and a second inorganic precursor 46. The second solvent 42 may be the same as the first solvent 32, and may be hexane. The organic material 44 may be an organic material used for a ligand of known quantum dots in the related art, or may be the same material as that of the ligand 18. The second inorganic precursor 46 contains the same material as the third shell 38 described above. When the material of the third shell 38 is the same as the material of the second shell 26, the second inorganic precursor 46 is the same as the first inorganic precursor 30.

Subsequently, the heating of the array substrate 3, on which the second solution 40 is applied, is restarted. Here, a step of fourth heating is performed by heating the atmosphere to a temperature equal to or higher than a fourth temperature T4 indicated in FIG. 14 (step S16).

The fourth temperature T4 is the higher temperature of a melting point of the organic material 44 and a boiling point of the second solvent 42. A temperature TC indicated in FIG. 4 is the lower temperature of the melting point of the organic material 44 and the boiling point of the second solvent 42. The fourth temperature T4 and the temperature TC are higher than the temperature T0. The fourth temperature T4 may be equal to the first temperature T1, and the temperature TC may be equal to the temperature TA.

The ambient temperature of the quantum dots 20 follows a rise of the atmospheric temperature, as depicted in FIG. 14, until the atmospheric temperature rises from the temperature T0 to the temperature TC. However, when the ambient temperature of the quantum dots 20 rises up to the temperature TC and one of the melting of the organic material 44 and the evaporation of the second solvent 42 begins, the ambient temperature of the quantum dots 20 maintains the temperature TC for a while.

By further carrying on the heating of the atmosphere, one of the melting of the organic material 44 and the evaporation of the second solvent 42 ends, and the ambient temperature of the quantum dots 20 begins to rise again. Then, when the ambient temperature of the quantum dots 20 rises up to the fourth temperature T4 and the other one of the melting of the organic material 44 and the evaporation of the second solvent 42 begins, the ambient temperature of the quantum dots 20 maintains the fourth temperature T4 for a while.

Thus, by the step of the fourth heating, the melting of the organic material 44 and the evaporation of the second solvent 42 are completed. After the completion of the step of the fourth heating, as illustrated in FIG. 16A, the second solvent 42 has vaporized from above the array substrate 3, and the second inorganic precursor 46 is dispersed in the periphery of the first quantum dots 16 in the melted organic material 44. Note that a scale of the second inorganic precursor 46 is changed only in FIG. 16A for illustration, but an actual shape of the second inorganic precursor 46 may be invariant before and after the step of the fourth heating.

Subsequently, the heating of the array substrate 3 is continued until the atmospheric temperature reaches a fifth temperature T5 indicated in FIG. 14. From the point in time when the atmospheric temperature reaches the fifth temperature T5, a step of fifth heating is performed in which heating conditions are adjusted to maintain the atmospheric temperature at approximately the fifth temperature T5 (step S17).

After the completion of the melting of the organic material 44 and the evaporation of the second solvent 42, the ambient temperature of the quantum dots 20 rises from the fourth temperature T4 and reaches the fifth temperature T5. Since the atmospheric temperature is maintained at the fifth temperature T5, the ambient temperature of the quantum dots 20 having reached the fifth temperature T5 is also maintained at the fifth temperature T5.

The fifth temperature T5 is higher than the fourth temperature T4, and is a temperature at which the second inorganic precursor 46 epitaxially grows around the second shell 26 by thermochemical reaction. Thus, while the ambient temperature of the quantum dots 20 is maintained at the fifth temperature T5, the second inorganic precursor 46 gradually grows epitaxially around the second shell 26. With this, the third shell 38 is formed around the second shell 26 of each first quantum dot 16, as illustrated in FIG. 16B.

As described above, as illustrated in FIG. 16B, the first quantum dot 16 including the quantum dot 20, the second shell 26, and the third shell 38 is formed. Note that, in the step of the fifth heating, by forming the third shell 38, the melted organic material 44 is pushed up to an upper layer, whereby the organic material 44 remains in the upper layer.

Subsequently, a step of sixth heating is performed in which the atmosphere is heated so that the atmospheric temperature further rises to reach a sixth temperature T6 or higher (step S18). The sixth temperature T6 is higher than the fifth temperature T5, and is equivalent to the boiling point of the organic material 44.

When the ambient temperature of the quantum dots 20 reaches the sixth temperature T6 by heating the atmosphere in the step of the sixth heating, evaporation of the organic material 44 begins and the ambient temperature of the quantum dots 20 maintains the sixth temperature T6 for a while. With this, in the step of the sixth heating, the organic material 44 vaporizes, and as illustrated in FIG. 17, the organic material 44 is removed. As described above, the step of forming the light-emitting layer in the present embodiment is completed.

In the light-emitting device 1 according to the present embodiment, the third shell 38 is formed around the second shell 26. Further, the third shell 38 is formed to fill the void 34 around the first quantum dot 16.

Thus, the first quantum dots 16 according the present embodiment have a higher proportion of the volume to the entire volume of the light-emitting layer 8 compared to the first quantum dots 16 in the previous embodiments. That is, the light-emitting layer 8 in the present embodiment has an improvement in filling rate of the shell formed around a core 22 of the quantum dot 20 in the light-emitting layer 8. In other words, after the step of the fifth heating is performed, the density of inorganic matters with respect to the entire volume of the light-emitting layer 8 is greater than that before the step of the fifth heating is performed. Therefore, with the configuration described above, the light-emitting device 1 according to the present embodiment can further improve the reliability of the light-emitting layer 8.

In the present embodiment, after the step of the second heating is performed, the step of the third heating may be omitted, and the step of the temperature lowering and subsequent steps may be performed sequentially. That is, the vaporization of the ligand 18 and the vaporization of the organic material 44 may be performed collectively in the step of the sixth heating. With this, the number of heating steps is decreased, which leads to a decrease in tact time and a reduction in manufacturing cost.

In the present embodiment, although not limited thereto, the step of forming the light-emitting layer is described in the case where the fourth temperature T4 is equal to the first temperature T1, the fifth temperature T5 is equal to the second temperature T2, and the sixth temperature T6 is equal to the third temperature T3. Such a configuration may be realized simply and easily by making the first solvent 32 and the second solvent 42 be the same, the material of the ligand 18 and the organic material 44 be the same, and the first inorganic precursor 30 and the second inorganic precursor 46 be the same.

With this, the temperature as the heating reference for each heating step may be adjusted between the steps from the first heating to third heating and the steps from the fourth heating to sixth heating. Accordingly, the configuration described above leads to a simplification of the entire step of forming the light-emitting layer.

In each of the embodiments described above, a case has been described in which the quantum dot layer including the quantum dots 20 is the light-emitting layer 8. However, no such limitation is intended, and the first charge transport layer 6 or the second charge transport layer 10 may be the quantum dot layer including the quantum dots 20, for example. In this manner, in the case where each charge transport layer includes the quantum dots 20, these quantum dots 20 may be provided with a function to transport carriers. In this case, in comparison with a charge transport layer including known quantum dots, the stability of the quantum dots 20 in each charge transport layer is improved, so that the efficiency of carrier transport in each of the charge transport layers is improved, leading to an improvement in the luminous efficiency of the light-emitting device 1. Each of the charge transport layers including the quantum dots 20 described above may also be formed by the same technique as the step of forming the quantum dot layer in each of the embodiments.

In each of the above-described embodiments, a display device including a plurality of light-emitting elements and having a display face DS is exemplified to describe the configuration of the light-emitting device 1. However, the disclosure is not limited thereto, and the light-emitting device 1 in each of the embodiments described above may be a light-emitting device including a single light-emitting element.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A method for manufacturing a light-emitting device including, on a substrate, a light-emitting element including a first electrode, a second electrode, and a quantum dot layer between the first electrode and the second electrode, the method comprising:
    forming the quantum dot layer,
    wherein the forming the quantum dot layer includes
    performing first application of applying, on a position overlapping with the substrate, a first solution including a first solvent, a plurality of quantum dots, a ligand, and a first inorganic precursor, the plurality of quantum dots each including a core and a first shell coating the core, the ligand coordinating with each of the plurality of quantum dots,
    performing first heating of raising an atmospheric temperature around the substrate to a first temperature or higher after the performing first application, the first temperature being a higher temperature of a melting point of the ligand and a boiling point of the first solvent, and
    performing second heating of raising the atmospheric temperature to a second temperature after the performing first heating, the second temperature being higher than the first temperature and being a temperature at which the first inorganic precursor epitaxially grows around the first shell and a second shell coating the first shell is formed to form a plurality of first quantum dots, and
    in the performing second heating, the plurality of first quantum dots are formed in the quantum dot layer, and a plurality of second quantum dots each including, in a core, the same material as a material of the plurality of second shells are also formed.

2. The method for manufacturing a light-emitting device according to claim 1,
    wherein the forming the quantum dot layer includes lowering a temperature from the second temperature while the first inorganic precursor epitaxially grows around the first shell after the performing second heating.

3. The method for manufacturing a light-emitting device according to claim 2,
    wherein in the lowering the temperature, the atmospheric temperature is lowered to a temperature or lower, the temperature being a lower temperature of the melting point of the ligand and the boiling point of the first solvent,
    the forming the quantum dot layer further includes
    performing second application of applying a second solution on a position overlapping with the substrate after the lowering the temperature,
    performing fourth heating of raising the atmospheric temperature to a fourth temperature or higher after the performing second application, and
    performing fifth heating of raising the atmospheric temperature to a fifth temperature after the performing fourth heating,
    the second solution includes a second solvent, a plurality of organic materials, and a plurality of second inorganic precursors,
    the fourth temperature is a higher temperature of a melting point of the plurality of organic materials and a boiling point of the second solvent, and
    the fifth temperature is higher than the fourth temperature, and is a temperature at which the plurality of second inorganic precursors epitaxially grow around the plurality of second shells and a plurality of third shells filling at least a part of a void around the plurality of second shells are formed.

4. The method for manufacturing a light-emitting device according to claim 3,
    wherein, after the performing fifth heating, density of inorganic matters with respect to entire volume of the quantum dot layer is greater than density before the performing fifth heating.

5. The method for manufacturing a light-emitting device according to claim 3,
    wherein the fourth temperature is equal to the first temperature.

6. The method for manufacturing a light-emitting device according to claim 3,
    wherein the fifth temperature is equal to the second temperature.

7. The method for manufacturing a light-emitting device according to claim 3,
    wherein the forming the quantum dot layer further includes performing sixth heating of raising the atmospheric temperature to a sixth temperature after the performing fifth heating, the sixth temperature is higher than the fifth temperature and is a boiling point of the plurality of organic materials, and the organic materials vaporize in the performing sixth heating.

8. The method for manufacturing a light-emitting device according to claim 7, wherein the plurality of organic materials are the same as a material of the ligand.

9. The method for manufacturing a light-emitting device according to claim 7, wherein, the forming the quantum dot layer further includes performing third heating of raising the atmospheric temperature to a third temperature between the performing second heating and the lowering the temperature, the third temperature is higher than the second temperature and is the boiling point of the ligand, and the ligand vaporizes in the performing third heating.

10. The method for manufacturing a light-emitting device according to claim 9, wherein the sixth temperature is equal to the third temperature.

11. The method for manufacturing a light-emitting device according to claim 1, wherein the core of each of the plurality of second quantum dots is formed of the first inorganic precursor.

12. The method for manufacturing a light-emitting device according to claim 1, wherein the second quantum dot is formed of only a core.

13. The method for manufacturing a light-emitting device according to claim 1, wherein the first temperature is the boiling point of the first solvent, and in the performing first heating, the first solvent vaporizes after the ligand melts.

14. The method for manufacturing a light-emitting device according to claim 1, wherein the first temperature is the melting point of the ligand, and in the performing first heating, the ligand melts after the first solvent vaporizes.

15. The method for manufacturing a light-emitting device according to claim 1, wherein the forming the quantum dot layer includes performing third heating of raising the atmospheric temperature to a third temperature or higher after the performing second heating, the third temperature is higher than the second temperature and is a boiling point of the ligand, and the ligand vaporizes in the performing third heating.

16. A light-emitting device comprising:

on a substrate, a light-emitting element including a first electrode, a second electrode, and a quantum dot layer between the first electrode and the second electrode, wherein the quantum dot layer includes a plurality of first quantum dots each including a core, a first shell coating the core, and a second shell coating the first shell, the first shell and the second shell having a crystal structure, and a plurality of second quantum dots each including, in a core, the same material as a material of the second shell.

17. The light-emitting device according to claim 16, wherein each of the plurality of first quantum dots and each of the plurality of second quantum dots are separated from each other.

18. The light-emitting device according to claim 16, wherein, in the plurality of first quantum dots, the first quantum dots adjacent to each other are separated from each other.

19. The light-emitting device according to claim 16, wherein the second quantum dot is formed by using a semiconductor material having a band gap of equal to or greater than 3.1 eV.

20. The light-emitting device according to claim 16, wherein the second quantum dot is formed by using a semiconductor material having a band gap of less than 3.1 eV, and has a particle diameter having a light emission wavelength of equal to or less than 400 nm.

21. The light-emitting device according to claim 16, wherein an average film thickness of the first shell is less than a minimum film thickness of the second shell.

22. The light-emitting device according to claim 16, wherein, in the quantum dot layer, the second shells of at least one set of the first quantum dots adjacent to each other among the plurality of first quantum dots are connected to each other, and, in the plurality of first quantum dots, a ratio that the second shells of the first quantum dots adjacent to each other are connected to each other is greater than 50 percent and less than or equal to 100 percent.

23. The light-emitting device according to claim 16, wherein a proportion of volume of the plurality of first quantum dots to volume of the entire quantum dot layer is equal to or greater than 63.7 percent.

24. The light-emitting device according to claim 16, wherein a volume ratio of an organic matter to an inorganic matter in the quantum dot layer is equal to or less than 36.3 volume percent.

25. The light-emitting device according to claim 16, wherein the core of each of the plurality of first quantum dots is InP, and the plurality of first shells and the plurality of second shells are ZnS, and an average value of a shortest distance from the core of one first quantum dot to the core of another first quantum dot adjacent to the one first quantum dot among the plurality of first quantum dots is equal to or greater than 3 nm.

26. The light-emitting device according to claim 16, wherein the core of each of the plurality of first quantum dots is CdSe, and the plurality of first shells and the plurality of second shells are ZnS, and an average value of a shortest distance from the core of one first quantum dot to the core of another first quantum dot adjacent to the one quantum dot among the plurality of first quantum dots is equal to or greater than 1 nm.

* * * * *